(12) United States Patent
Kremin et al.

(10) Patent No.: US 9,151,792 B1
(45) Date of Patent: Oct. 6, 2015

(54) HIGH-VOLTAGE, HIGH-SENSITIVITY SELF-CAPACITANCE SENSING

(71) Applicant: Cypress Semiconductor Corporation, San Jose, CA (US)

(72) Inventors: Viktor Kremin, Lviv (UA); Andriy Maharyta, Lviv (UA); Michael P. Hills, Lynnwood, WA (US)

(73) Assignee: Cyress Semiconductor Corporation, San Jose, CA (US)

( * ) Notice: Subject to any disclaimer, the term of this patent is extended or adjusted under 35 U.S.C. 154(b) by 41 days.

(21) Appl. No.: 14/479,193

(22) Filed: Sep. 5, 2014

Related U.S. Application Data

(60) Provisional application No. 62/004,589, filed on May 29, 2014.

(51) Int. Cl.
*G01R 27/26* (2006.01)
*G06F 1/16* (2006.01)

(52) U.S. Cl.
CPC ............ *G01R 27/2605* (2013.01); *G06F 1/169* (2013.01)

(58) Field of Classification Search
CPC ............ G01R 27/2605; G01R 31/028; G01R 31/312; G01R 31/08; G01R 31/2805; G01D 5/24; G01D 5/2417; H03K 17/962; H03K 17/955; G06F 3/0488; G06F 3/04883; G06F 3/044; G06F 3/04886; G06F 3/045
USPC ............ 324/658–690; 345/173–174
See application file for complete search history.

(56) References Cited

U.S. PATENT DOCUMENTS

| | | | | |
|---|---|---|---|---|
| 7,154,393 B2 * | 12/2006 | Okushima et al. | ............ | 340/562 |
| 7,864,992 B2 * | 1/2011 | Riedijk et al. | ................ | 382/124 |
| 7,876,311 B2 | 1/2011 | Krah et al. | | |
| 8,610,443 B1 | 12/2013 | Ryshtun et al. | | |
| 8,723,825 B2 * | 5/2014 | Wright et al. | ................ | 345/173 |

(Continued)

FOREIGN PATENT DOCUMENTS

WO 2011014580 A1 2/2011
WO 2013058446 A1 4/2013

OTHER PUBLICATIONS

Semiconductors Components Industries, "Touch Technology for Design and Application" Jan. 2014 Rev. 2 Publication Order No. TND6038/D http://onsemi.com. 9 pages.

(Continued)

*Primary Examiner* — Huy Q Phan
*Assistant Examiner* — Thang Le
(74) *Attorney, Agent, or Firm* — Lowenstein Sandler LLP

(57) ABSTRACT

Apparatuses and methods of high-voltage capacitance-sensing circuits are described. One apparatus includes a capacitance-sensing circuit coupled to a capacitive-sense array of electrodes. The capacitance-sensing circuit includes a self-capacitance sensing channel, a first voltage source (e.g., a low-voltage drive source) to drive a reference voltage, and a second voltage source (e.g., high-voltage drive source) to drive a sensing voltage. The sensing voltage is greater in magnitude than the reference voltage. The capacitance-sensing circuit also includes 1) a first set of switches to selectively couple the self-capacitance sensing channel or the second voltage source to a sensing electrode of the capacitance-sensing array; and 2) a second set of switches to selectively couple the first voltage source or the second voltage source to a shielding electrode of the capacitance-sensing array.

20 Claims, 15 Drawing Sheets

(56) References Cited

U.S. PATENT DOCUMENTS

| | | | |
|---|---|---|---|
| 2010/0052700 A1* | 3/2010 | Yano et al. | 324/658 |
| 2010/0148806 A1* | 6/2010 | Hargreaves et al. | 324/679 |
| 2010/0259283 A1* | 10/2010 | Togura | 324/679 |
| 2011/0007021 A1* | 1/2011 | Bernstein et al. | 345/174 |
| 2011/0157077 A1 | 6/2011 | Martin et al. | |
| 2011/0242048 A1 | 10/2011 | Guedon et al. | |
| 2011/0254802 A1 | 10/2011 | Philipp | |
| 2011/0261006 A1 | 10/2011 | Joharapurkar et al. | |
| 2013/0113756 A1* | 5/2013 | Kim | 345/174 |
| 2013/0181949 A1* | 7/2013 | Setlak | 345/175 |
| 2013/0207677 A1* | 8/2013 | Togura | 324/685 |
| 2013/0222047 A1 | 8/2013 | Huang et al. | |
| 2013/0265276 A1 | 10/2013 | Obeidat et al. | |
| 2013/0285972 A1* | 10/2013 | Elias et al. | 345/174 |
| 2014/0103941 A1* | 4/2014 | Chou et al. | 324/658 |
| 2014/0152621 A1* | 6/2014 | Okayama et al. | 345/174 |
| 2014/0240022 A1* | 8/2014 | Larsen | 327/336 |

OTHER PUBLICATIONS

Patentability Search Report for CD14009. Jul. 2014. 4 pages.

* cited by examiner

HIGH-VOLTAGE, HIGH-SENSITIVITY SELF-CAPACITANCE SENSING

RELATED APPLICATIONS

This application claims the benefit of U.S. Provisional Application No. 62/004,589, filed May 29, 2014, the entire contents of which are incorporated by reference herein.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Transparent touch screens that utilize capacitive sense arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance: 1) mutual capacitance where the capacitance-sensing circuit has access to both electrodes of the capacitor; 2) self-capacitance where the capacitance-sensing circuit has only access to one electrode of the capacitor where the second electrode is tied to a DC voltage level or is parasitically coupled to Earth Ground. A touch panel has a distributed load of capacitance of both types (1) and (2) and Cypress' touch solutions sense both capacitances either uniquely or in hybrid form with its various sense modes.

BRIEF DESCRIPTION OF THE DRAWINGS

The present invention is illustrated by way of example, and not of limitation, in the figures of the accompanying drawings.

DETAILED DESCRIPTION

Apparatuses and methods of high-voltage capacitance-sensing circuits are described. One apparatus includes a capacitance-sensing circuit coupled to a capacitive-sense array of electrodes. The capacitance-sensing circuit includes a self-capacitance sensing channel, a first voltage source (e.g., a low-voltage drive source) to drive a reference voltage, and a second voltage source (e.g., high-voltage drive source) to drive a sensing voltage. The sensing voltage is greater in magnitude than the reference voltage. The capacitance-sensing circuit also includes 1) a first set of switches to selectively couple the self-capacitance sensing channel or the second voltage source to a sensing electrode of the capacitance-sensing array; and 2) a second set of switches to selectively couple the first voltage source or the second voltage source to a shielding electrode of the capacitance-sensing array.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment. It should be noted that the term capacitor, as used herein, may refer to any combination of conductors and dielectrics that produce a capacitance between the conductors, as well as discrete components. For example, as described herein, a capacitance can created as an intersection between two electrodes. An intersection between the first electrode and second electrode is also called a sensor. An intersection between two sense elements (electrodes) may be understood as a location at which one sense electrode crosses over or overlaps another, while maintaining galvanic isolation from each other. In other cases, a discrete capacitor may be used to produce a capacitance.

There are multiple configurations for the self-capacitance sensing circuits.

Figure 1:
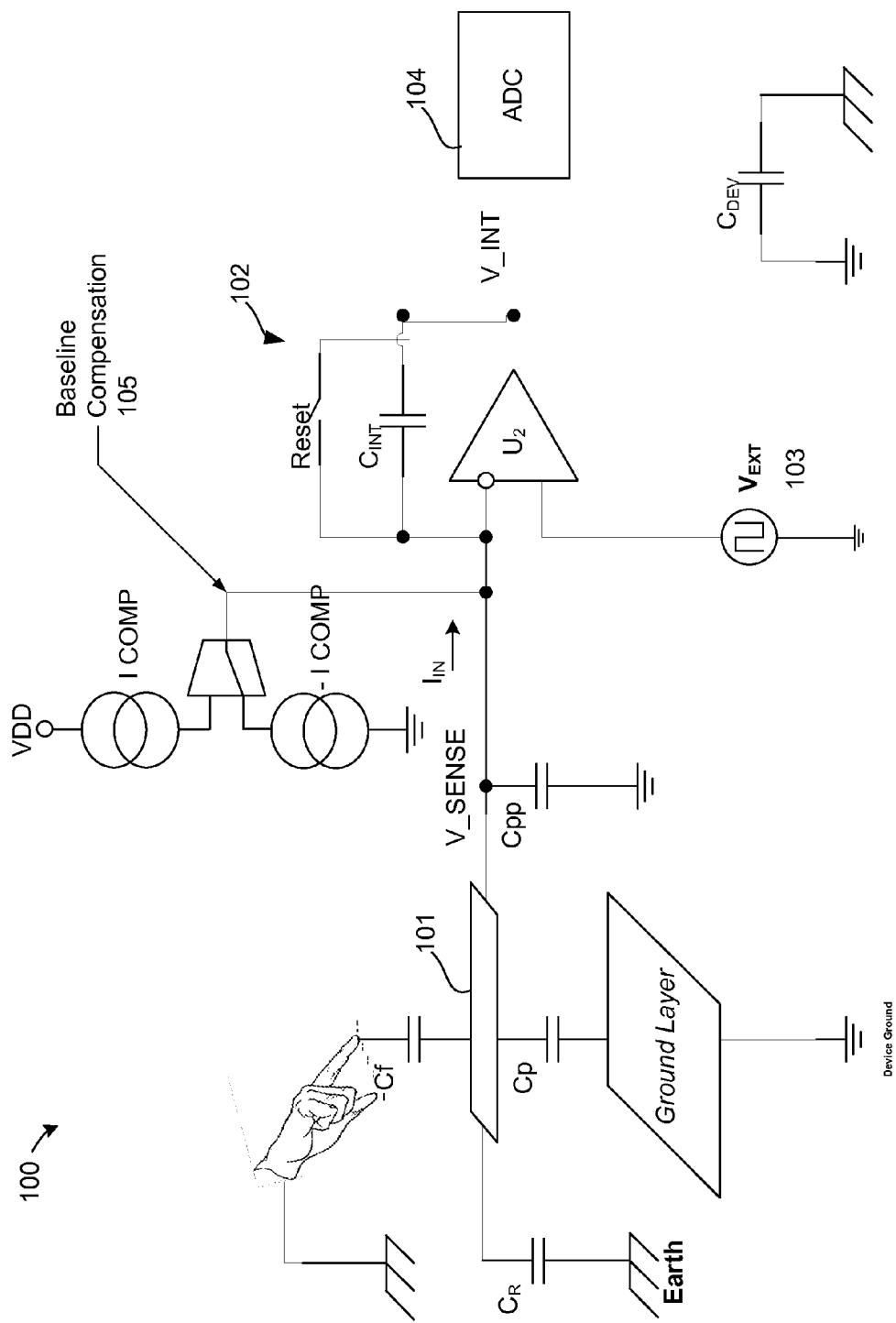
FIG. 1 is a circuit diagram illustrating a base circuit for self-capacitance sensing according to one implementation.

FIG. 1 is a circuit diagram illustrating a base circuit 100 for self-capacitance sensing according to one implementation. In the base circuit 100, shown in FIG. 1, a sensing electrode 101 (referred to below as sensor) of a touch panel is driven by an active integrator 102, where its drive voltage is provided by an excitation source $V_{EXT}$ 103. The excitation voltage provided by the excitation source $V_{EXT}$ 103 is limited by the low-voltage nature of conventional touch-controllers designs and its power supplies, e.g. powered from 3.3V power supply. The integrated charge measured by the active integrator 102 is sampled by an analog-to-digital converter (ADC) 104 and used for subsequent processing, such as filtering, accumulation, or the like.

In the typical configuration, the following parameters in Table 1 may be used:

TABLE 1

Parameter examples for the typical cell phone application

| Label | Typical value | Description |
| --- | --- | --- |
| $C_F$ | ≈1 fF | Finger hover signal at 30 mm distance |
| $C_R$ | 1 pF | Sensor capacitance to Earth |
| $C_S$ | 50 pF | Sensor to bottom panel layer capacitance |
| $C_{INT}$ | 30 pF | Integration capacitor value |
| $V_{EXT}$ | 2 V | Sensor excitation voltage |

In the base circuit 100, the integrator input charge is defined by the sum of the parasitic capacitance (Cp) and finger capacitance (Cf), connected in series with device capacitance (Cdev). Taking into account that Cf is much smaller as compared to Cdev, it is possible to determine the integrator input charge by a sum of the parasitic capacitances (Cpp+Cp) and finger capacitances Cf. In practical applications, Cf is in several orders smaller than parasitic capacitances. As a result, most of a dynamic range of the active integrator 102 and ADC 104 is utilized by the charge, coming from non-informative parasitic capacitances, preventing accurate touch signal resolution.

There are some conventional techniques to reduce impact of the parasitic capacitance. As illustrated in FIG. 1, a baseline compensation circuit 105 (e.g., current sources) can be used to reduce impact of the parasitic capacitance. The baselines compensation circuit 105 injects compensation current opposite to the current coming from the sensing electrode of the panel. It should be noted that the baseline compensation circuit 105 may add noise to the sampling and conversion.

The sensing arrangement, described in FIG. 1 may have the following drawbacks: 1) Large input charge requires large baseline compensation signal; 2) Large compensation signal has larger noise component, which masks the very small useful signal changes on the sensing electrode; and 3) Low sensor excitation voltage (e.g. 2V) translates into very low touch signal charge, masked by internally generated noise signals (e.g. from baseline compensation circuit 105) or noise signals originated from finger (e.g. charger noise), or the like.

Figure 2:
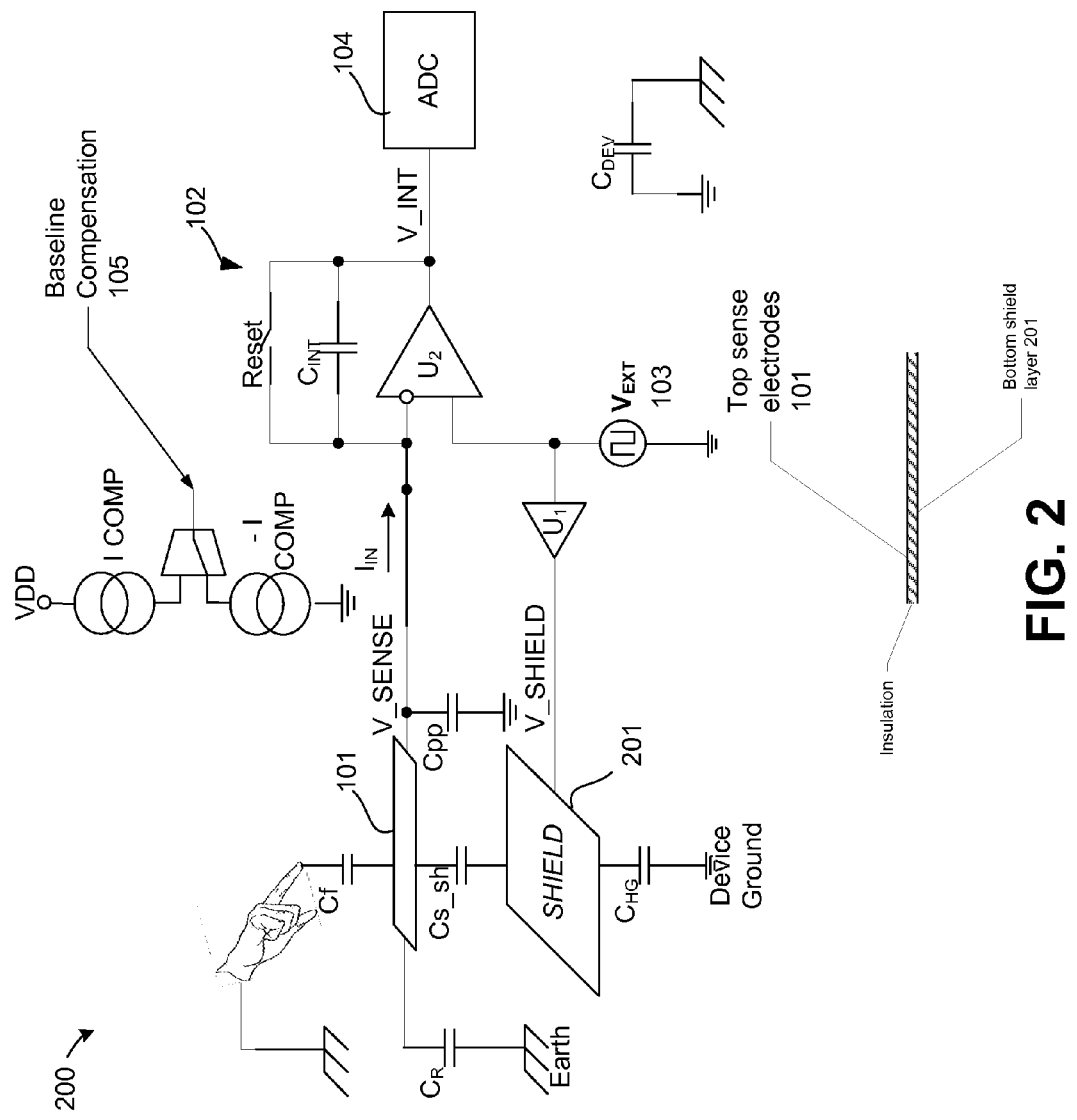
FIG. 2 is a circuit diagram illustrating a second circuit for self-capacitance sensing with an active shield layer according to another implementation.

Another technique of reducing parasitic capacitance can be done by driving a bottom shield layer. FIG. 2 is a circuit diagram illustrating a second circuit 200 for self-capacitance sensing with an active shield layer 201 according to another implementation. The second circuit 200 is similar to the base circuit 100 as noted by similar reference labels. However, in this second circuit 200, a shield signal follows the excitation signal from the excitation source $V_{EXT}$ 103, virtually eliminating the impact of a capacitance between the sensing electrode 101 to panel bottom shield layer 202. However, the capacitances from capacitance-sensing pins and routing may remain uncompensated. The baselines compensation circuit 105 may be used.

The sensing arrangement, described in FIG. 2 may have the following drawbacks: 1) Still needs baseline compensation circuit 105, as active shield layer 201 does not compensate for all capacitances in the design; and 2) Low sensor excitation voltage (e.g. 2V) translates into very low touch signal charge, masked by internally generated noise signals (e.g. from baseline compensation circuits) or noise signals originated from finger (e.g. charger noise), or the like.

Figure 3:
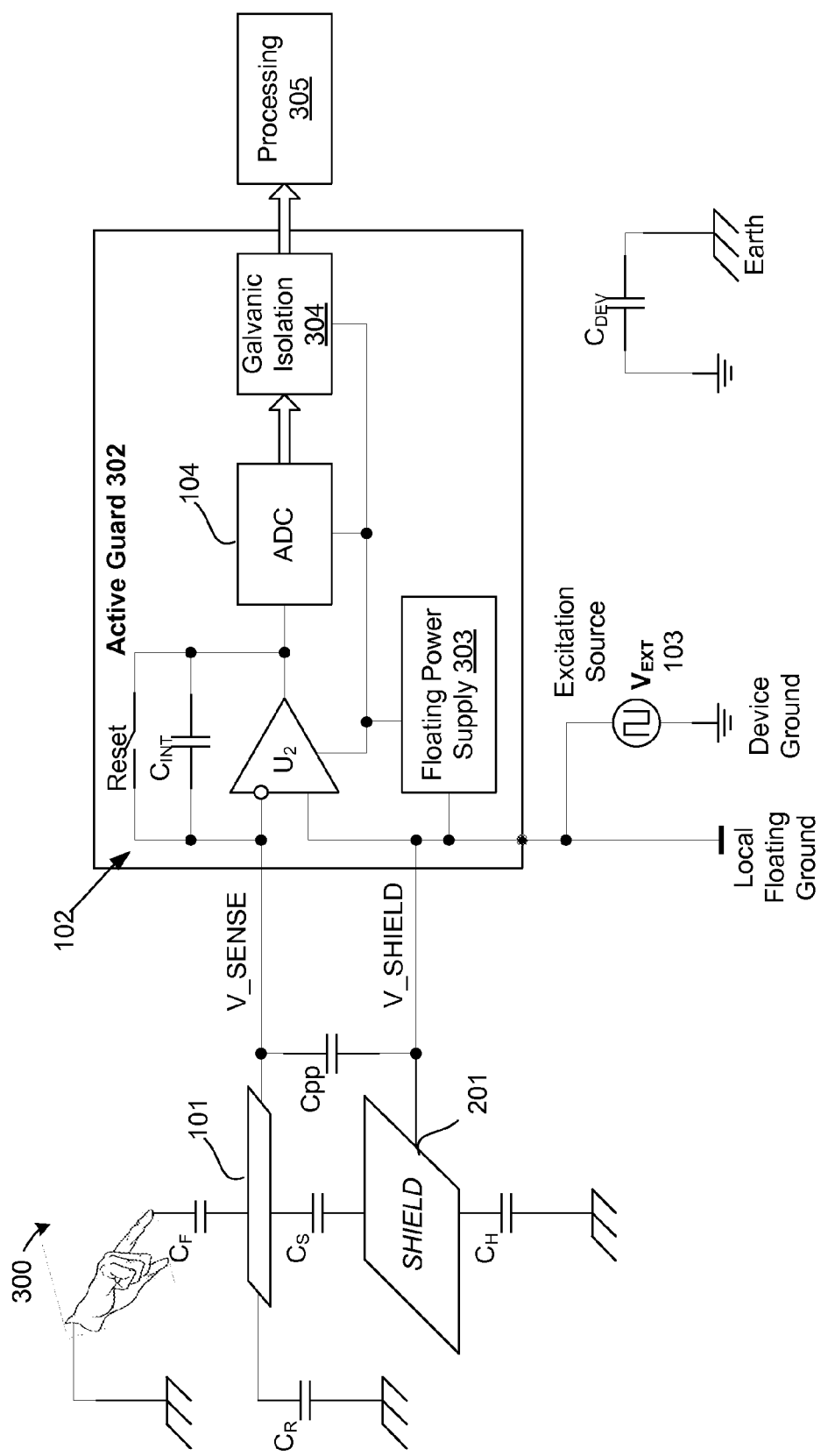
FIG. 3 is a circuit diagram illustrating a third circuit for self-capacitance sensing with an active shield layer in combination with active shielding for entire analog-front-end circuit according to another implementation.

FIG. 3 is a circuit diagram illustrating a third circuit 300 for self-capacitance sensing with an active shield layer 201 in combination with active shielding 302 (referred to as "Active Guard") for entire analog-front-end circuit according to another implementation. The third circuit 300 is similar to the second circuit 200 as noted by similar reference numbers. The active shielding 302 is provided for the AFE, including the active integrator 102 and ADC 104, using a floating power supply 303 and circuitry 304 to provide isolated data communication channel (e.g., galvanic isolation) with subsequent processing 305. The active shielding 302 can be used in addition to panel shielding as described above with respect to FIG. 2. This approach allows reaching lowest input current level (see analysis later), but requires complex integrated circuit design, as different portions of circuit have different power supplies and cannot use common ground.

The sensing arrangement, described in FIG. 3 may have the following drawbacks: 1) Very complex design, as within one integrated circuit ("chip"); 2) Needs to have active shielded AFE using a floating power supply and an isolated data communication channel.

The high-distance hover and proximity sensing in the touch devices (e.g., tablets, smartphones, personal digital assistants (PDAs)) can be achieved using self-capacitance sensing with active shield. In the self-capacitance sensing mode with active shield technique, the sensing electrode's electric field does not decay so quickly as in a mutual capacitance mode, as multiple small electrodes have same potential to form a virtual, large sensing electrode (large virtual equipotential surface). This virtual, large sensing electrode allows a detection distance of the electric field to be similar to a size of the entire touch panel. Whereas, in the mutual capacitance sensing mode, electric field is concentrated mostly in local an intersection (RX-TX area cross-section), so detection distance is limited in general to be similar to an individual sensor size (intersection of two electrodes).

The embodiments described below are directed to a high-voltage, low-baseline self-capacitance sensing with and without galvanic isolation.

Figure 4:
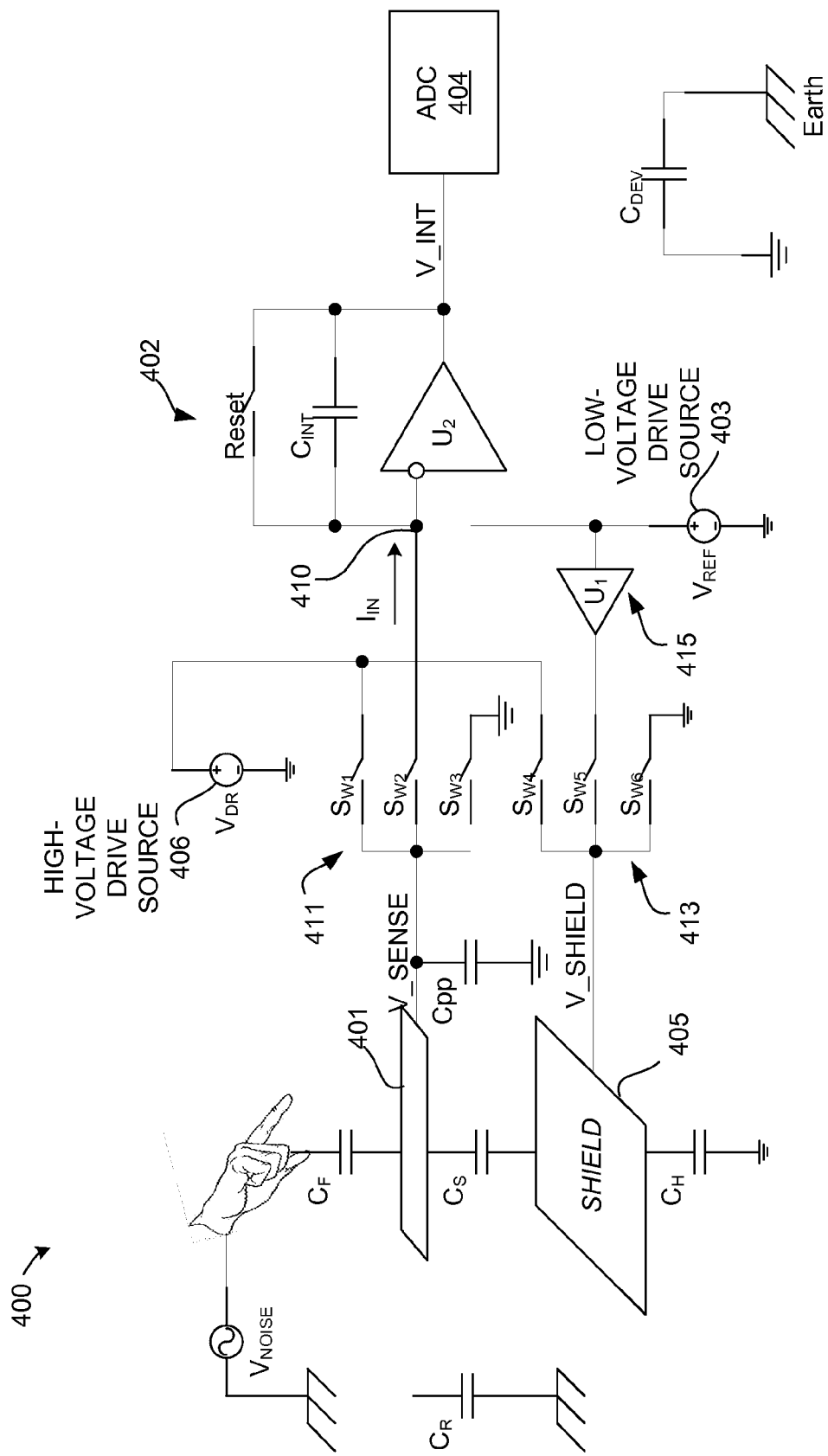
FIG. 4 is a circuit diagram illustrating a high-voltage capacitance-sensing circuit for self-capacitance sensing according to one embodiment.

FIG. 4 is a circuit diagram illustrating a high-voltage (HV) capacitance-sensing circuit 400 for self-capacitance sensing according to one embodiment. The HV capacitance-sensing circuit 400 can be used for high-voltage, low-baseline self-capacitance sensing without galvanic isolation. The HV capacitance-sensing circuit 400 has the ability to detect very small capacitance changes for high-distance hover and proximity sensing in the touch devices (e.g., tablets, smartphones, PDAs, or the like).

The HV capacitance-sensing circuit 400 is coupled to a touch panel with a sensing electrode 401 and a shielding electrode 405. The HV capacitance-sensing circuit 400 includes analog front-end circuitry to form a self-capacitance sensing channel. In the depicted embodiment, the self-capacitance sensing channel is formed by an active integrator 402, including an operational amplifier and an integrator capacitor, and an ADC 404. The active integrator 402 can also include a reset switch to reset integration. An input current of the active integrator 402 is integrated on the integrator capacitor ($C_{INT}$) for a duration of charge integration phase. The sensing circuit operates at the panel full charge/discharge principle: at the end of each operation phase sensor current drops almost to zero and total transferred charge amount is determined by the sensor voltage swing between phases and sensing capacitance. This transferred from/to sensing electrode 401 charge is being integrated by the active integrator and causes the integrator output voltage step by $V=Q/C_{INT}$. The ADC 402 measures an output voltage (V_INT) from the active integrator 402 and convers the voltage to a digital value. The digital value may represent the capacitance measured on the sensing electrode 401.

Instead of the input current being balanced by a current source, as illustrated in FIGS. 1-2, the HV capacitance-sensing circuit 400 includes two voltage sources: a first voltage source for a low-voltage drive source 403 and a second voltage source for a high-voltage drive source 406. The low-voltage drive source 403 is a direct current (DC) reference voltage source that drives a reference voltage ($V_{REF}$). This reference voltage is a low voltage (e.g., less than 5 V). The low-voltage drive source 403 drives the active integrator 402. For example, a non-inverting input of the operational amplifier is coupled to receive the reference voltage from the low-voltage drive source 403. The low-voltage drive source 403 also can drive the shielding electrode 405, as described in more detail below. In one embodiment, a shielding electrode reference buffer $U_1$ 415 can be used to drive the shielding electrode 405 with the reference voltage. The high-voltage drive source 406 is a DC high-voltage source that drives a sensing voltage ($V_{DR}$). This sensing voltage is a high voltage (e.g., more than 5 V) that is greater in magnitude than the reference voltage. The high-voltage drive source 406 can also drive the sensing electrode 401 and the shielding electrode 405 with a high voltage, as described in more detail below.

The HV capacitance-sensing circuit 400 also includes a first set of switches 411 (e.g., $S_{W1}$-$S_{W3}$) and a second set of switches 413 (e.g., $S_{W4}$-$S_{W6}$). The first switches can be controlled to selectively couple an input node 410 of the active integrator 402 (or other the self-capacitance sensing channel), the high-voltage drive source 406, or a ground potential to the sensing electrode 401. The active integrator 402 is considered an input charge integrator $U_2$. The second set of switches 413 can be controlled to selectively couple the low-voltage drive source 403, the high-voltage drive source 406, or a ground potential to the shielding electrode 405. In another embodiment, the first set of switches 411 include two switches ((e.g., $S_{W1}$-$S_{W2}$) and the second set of switches 413 includes two switches (e.g., $S_{W4}$-$S_{W5}$) in which the first set of switches 411 can be controlled to selectively couple the input node 410 or the high-voltage drive source 406 to the sensing electrode 401. The first set of switches 411 does not include a third switch $S_{W3}$ to selectively couple the sensing electrode 401 to the ground potential. Similarly, the second set of switches 413 can be controlled to selectively couple the low-voltage drive source 403 or the high-voltage drive source 406 to the shielding electrode 405. The second set of switches 413 does not include a third switch $S_{W6}$ to selectively couple the shielding electrode 405 to the ground potential.

As described in more detail below, the first set of switches 411 and second set of switches 413 can be controlled to operate in one of a variety of modes, including, for example, in a four-phase, full-wave mode, in a two-phase, half-wave mode, or in a three-phase, half-wave mode with noise subtraction.

The following description clarifies full-wave and half-wave modes. In the full-wave modes, both charge current and discharge current used to measure capacitance on the sensing electrode 401 is sensed by the HV capacitance-sensing circuit 400. For example, in the depicted embodiment, both charge and discharge currents are integrated by the active integrator 402 and processed by ADC 404. In the half-wave modes, either charge current or discharge current (but not both) used to measure capacitance on the sensing electrode 401 is sensed by the HV capacitance-sensing circuit 400. For example, in the depicted embodiment, either the charge current or discharge current is integrated by the active integrator 402 and processed by ADC 404. Full-wave modes may have the following advantages: 1) up to two times the touch signal; 2) Not sensitive to noise from DC leakages from DC sources and low-frequency noise from alternating current (AC) main sources (e.g., 50/60 Hz); and 3) Not sensitive to middle point voltage drifts/offsets.

In one embodiment, the first set of switches 411 of the HV capacitance-sensing circuit 400 includes a first switch $S_{W1}$, a second switch $S_{W2}$ and a third switch $S_{W3}$, and the second set of switches 413 a fourth switch $S_{W4}$, a fifth switch $S_{W5}$ and a sixth switch $S_{W6}$. The HV capacitance-sensing circuit is operative to control the first set of switches and the second set of switches in one of a four-phase, full-wave mode, a three-phase, half-wave mode, or a two-phase, half-wave mode, as descried in more detail below.

In one embodiment, the first set of switches 411 of the HV capacitance-sensing circuit 400 includes a first switch $S_{W1}$ and a second switch $S_{W2}$ and the second set of switches 413 includes a third switch $S_{W3}$ and a fourth switch $S_{W5}$. The HV capacitance-sensing circuit is operative to control the first set of switches and the second set of switches in one of a three-phase, half-wave mode or a two-phase, half-wave mode, as descried in more detail below.

In one embodiment, a processing device includes an integrator, such as a passive integrator or an active integrator (e.g., operational amplifier based or a current-conveyor based integrator), and a multiplexer bus coupled to an input of the integrator. The multiplexer is configured to selectively couple the sensing electrode 401 of a sense array to either an input node of a capacitance-sensing channel, a high-voltage drive source or a ground potential as described herein. The multiplexer can also selectively couple the shielding electrode 405 to the high-voltage drive source, a low-voltage drive source, or a ground potential as described herein. In a further embodiment, the processing device includes an ADC coupled to an output of the integrator to convert an integrated capacitance to a digital value.

In the depicted embodiment, the integrator 402 is illustrated and described as an active integrator or operational amplifier integrator. In other embodiments, the integrator 402 may be a passive integrator, a current-conveyor integrator, or other circuit to perform integration.

The embodiments described herein can be implemented in a touchscreen controller used in a touchscreen device, such as a point of sale terminals, trackpads, or any other touch input device. The embodiments described herein can also be used in other touch devices, such as a computer trackpad, or other types of touch input devices. The embodiments described herein may also provide a noise abatement procedure for normal touches, which may be an improvement over the conventional data filtering methods.

Figure 5:
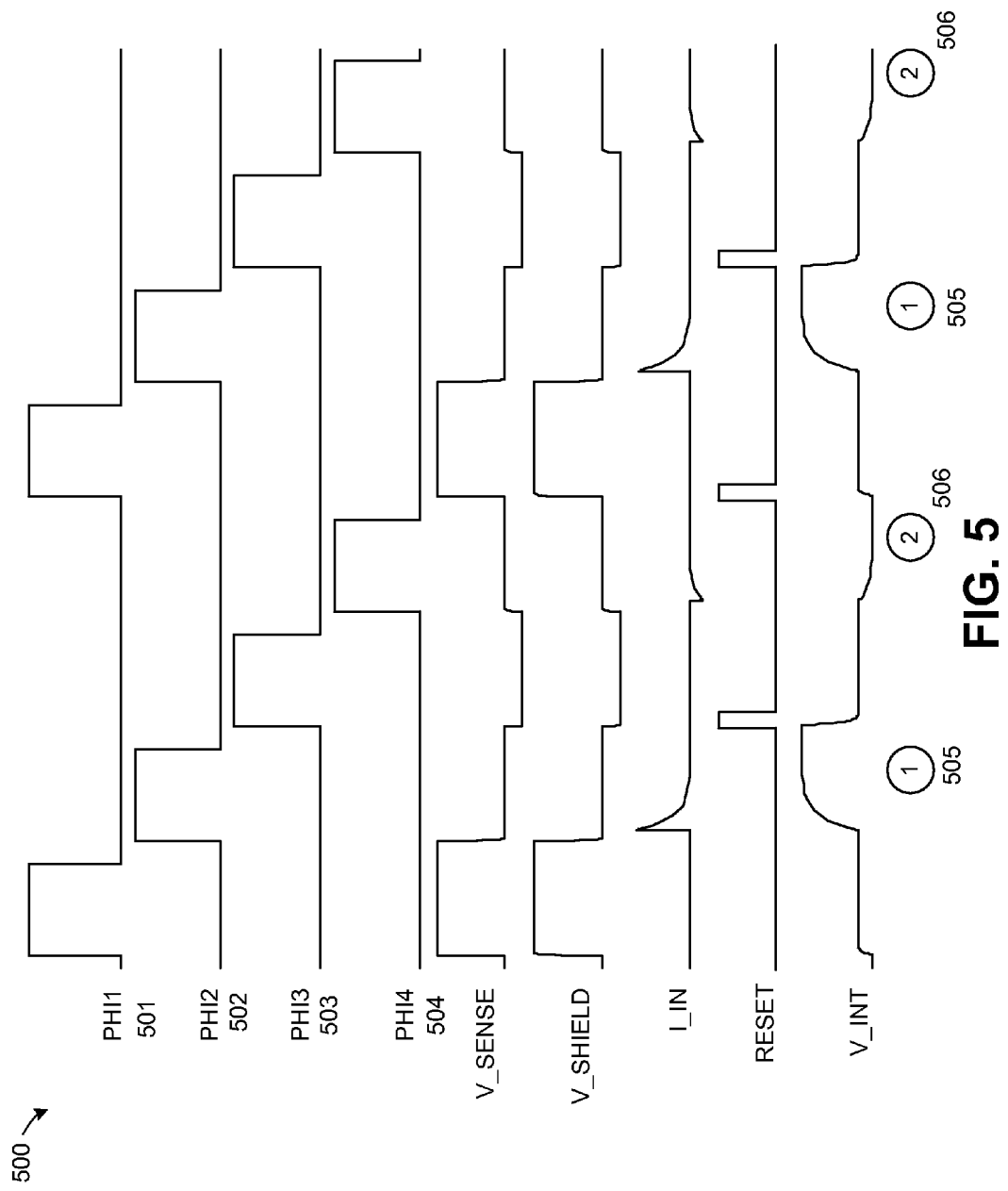
FIG. 5 is a waveform diagram illustrating operational waveforms in a four-phase, full-wave mode according to one embodiment.
Figure 6:
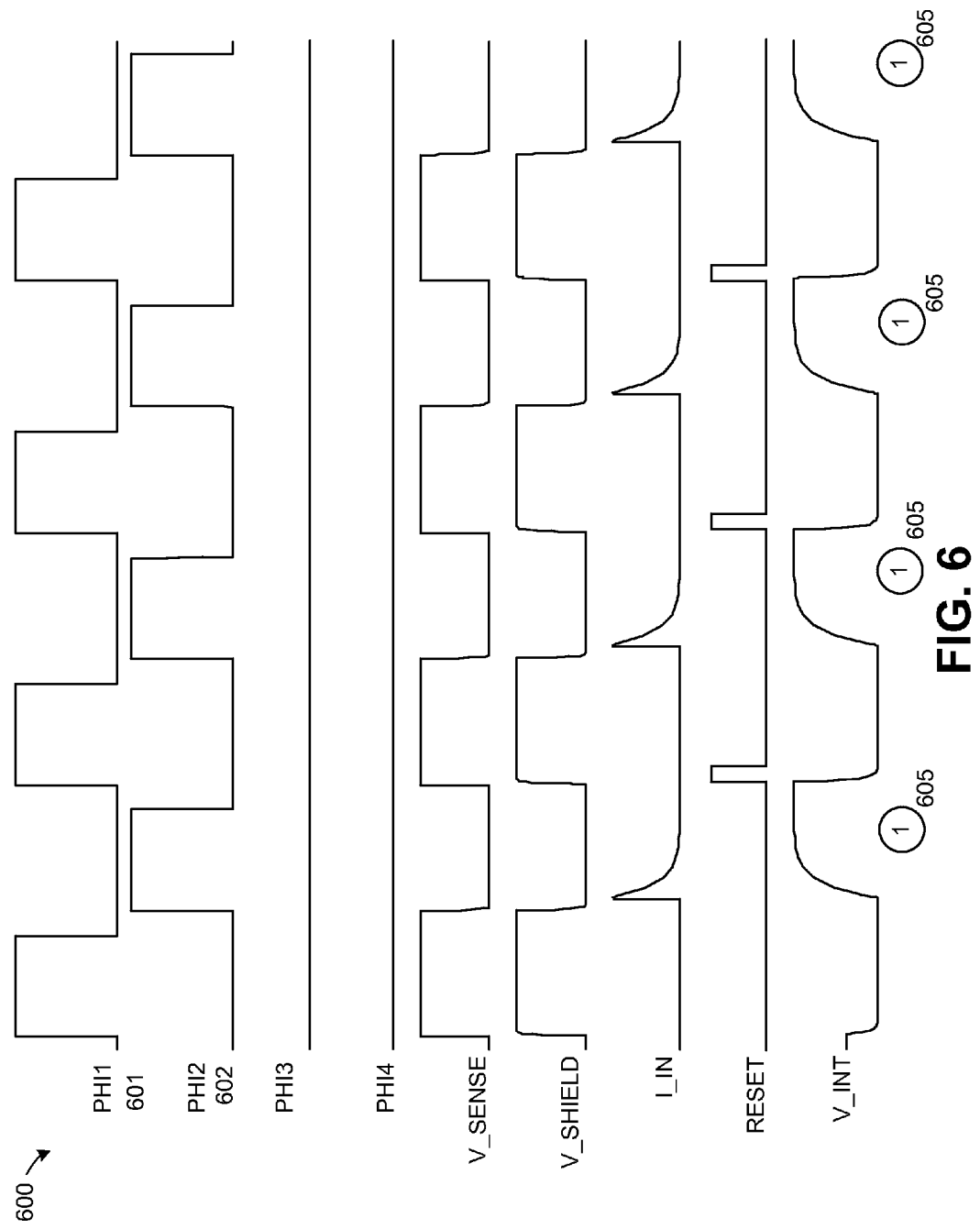
FIG. 6 is a waveform diagram illustrating operational waveforms in a two-phase, half-wave mode according to another embodiment.
Figure 7:
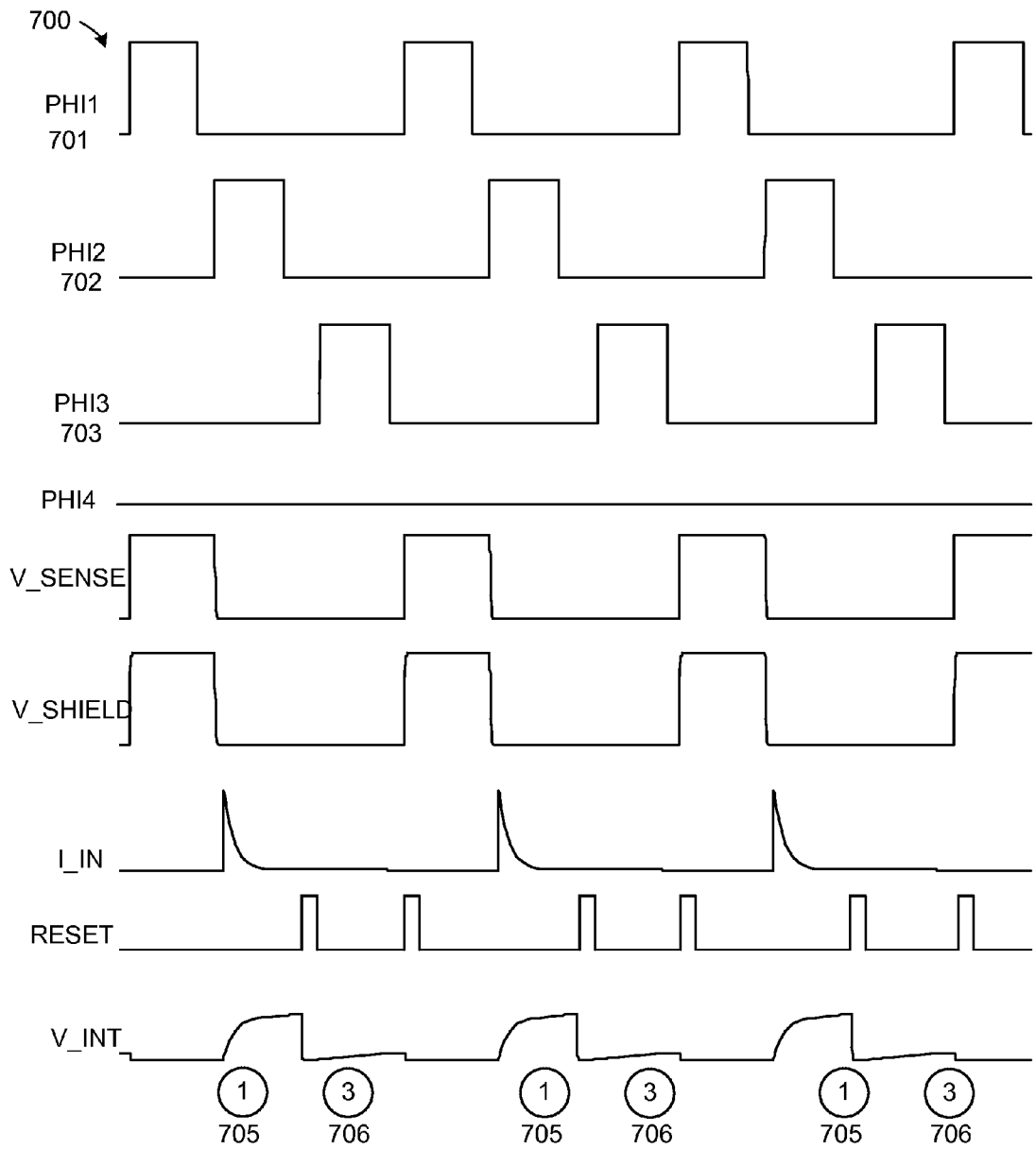
FIG. 7 is a waveform diagram illustrating operational waveforms in a three-phase, half-wave mode with noise subtraction according to another embodiment.

The operation sequences for the different modes are provided in the following Table 2, Table 3, and Table 4. The signal waveforms are shown in FIG. 5, FIG. 6, and FIG. 7, respectively. In these figures, the numbers inside circles (1), (2), (3) are used to show different signal integration stages and they are referenced later in the flowcharts or operation sequence tables.

FIG. 5 is a waveform diagram illustrating operational waveforms 500 in a four-phase, full-wave mode according to one embodiment. The operational sequence of the six switches of HV capacitance-sensing circuit 400 in the four-phase, full-wave mode is set forth in the following Table 3.

TABLE 3

Operational Sequence of Switches in the four-phase, full-wave mode

| Phase # | $S_{W1}$ | $S_{W2}$ | $S_{W3}$ | $S_{W4}$ | $S_{W5}$ | $S_{W6}$ | Comment |
|---|---|---|---|---|---|---|---|
| PHI1 | ON | OFF | OFF | ON | OFF | OFF | Charge panel from $V_{DR}$ |
| PHI2 | OFF | ON | OFF | OFF | ON | OFF | Positive charge transfer and result accumulation with positive sign (1) |
| PHI3 | OFF | OFF | ON | OFF | OFF | ON | Discharge panel to ground |
| PHI4 | OFF | ON | OFF | OFF | ON | OFF | Negative charge transfer and result accumulation with negative sign. (2) |

In another embodiment, the four-phase, full-wave mode includes: 1) a first phase in which the first switch $S_{W1}$ and the fourth switch $S_{W4}$ are turned on and the second switch $S_{W2}$, the third switch $S_{W3}$, the fifth switch $S_{W5}$, and the sixth switch $S_{W6}$ are turned off; 2) a second phase in which the second switch $S_{W2}$ and the fifth switch $S_{W5}$ are turned on and the first switch $S_{W1}$, the third switch $S_{W3}$, the fourth switch $S_{W4}$, and the sixth switch $S_{W6}$ are turned off; 3) a third phase in which the third switch $S_{W3}$ and the sixth switch $S_{W6}$ are turned on and the first switch $S_{W1}$, the second switch $S_{W2}$, the fourth switch $S_{W4}$, and the fifth switch $S_{W5}$ are turned off; and 4) a fourth phase in which the second switch $S_{W2}$ and the fifth switch $S_{W5}$ are turned on and the first switch $S_{W1}$, the third switch $S_{W3}$, the fourth switch $S_{W4}$ and the sixth switch $S_{W6}$ are turned off.

Referring to FIGS. 4 and 5, during a circuit conversion function by the HV capacitance-sensing circuit 400, the charge, accumulated in the finger capacitor Cf plus uncompensated parasitic capacitance Cpp (e.g. analog switches capacitance, routing, etc.) during charge phase, first phase PHIL 501, is equal to as set forth in the following equation (1):

$$Q_p = (Cpp + Cf) \cdot (Vdr - Vref) \quad (1)$$

The sensor-shield capacitance Cs is not charged, as voltages on both sensor and shield change synchronously and are same. This charge is transferred to the active integrator 402 during the second phage PHI2 502, resulting in the integrator's output voltage to change as set forth in the following equation (2):

$$Vint_p = \frac{Q_p}{Cint} = \frac{1}{Cint}(Cpp + Cf) \cdot (Vdr - Vref) \quad (2)$$

This is the positive charge transfer and result accumulation with positive sign (1) 505 in FIG. 5. During the third phase PHI3 503, the panel (e.g., both sensing electrode 401 and shielding electrode 405) is fully discharged to ground. Once the panel is connected to the integrator input in the fourth phage PHI4 504, the panel is charge to the reference voltage $V_{REF}$ and sinks from active integrator 402 the following charge as represented in equation (3):

$$Q_n = (Cpp + Cf) \cdot (0 - Vref) \quad (3)$$

This charge causes the integrator's output voltage to change as set forth in equation (4):

$$Vint_n = \frac{Q_n}{Cint} = \frac{1}{Cint}(Cpp + Cf) \quad (4)$$

This is the negative charge transfer and result accumulation with negative sign (2) 506 in FIG. 5. The system subtracts two integration results (either in analog or digital domains (e.g. subtract two ADC conversions)), so the final equivalent integrator output voltage change is measured as set forth in the following equation (5):

$$Vint = Vint_p - Vint_n = Vdr \frac{Cpp + Cf}{Cint} \quad (5)$$

As seen in equation (5), output charge does not depend on the Vref and solely depends on the Vdr. The output charge is proportional to the uncompensated parasitic capacitance Cpp and finger touch capacitance Cf.

FIG. 6 is a waveform diagram illustrating operational waveforms 600 in a two-phase, half-wave mode according to another embodiment. The operational sequence of the six switches of HV capacitance-sensing circuit 400 in the two-phase, half-wave mode is set forth in the following Table 4.

TABLE 4

Operational Sequence of Switches in the two-phase, half-wave mode

| Phase # | SW1 | SW2 | SW3 | SW4 | SW5 | SW6 | Comment |
|---|---|---|---|---|---|---|---|
| PHI1 | ON | OFF | OFF | ON | OFF | OFF | Charge panel from $V_{DR}$ |
| PHI2 | OFF | ON | OFF | OFF | ON | OFF | Positive charge transfer and result accumulation with positive sign (1) |

Referring to FIGS. 4 and 6, during a circuit conversion function by the HV capacitance-sensing circuit 400 in the two-phase, half-wave mode, the HV capacitance-sensing circuit 400 charges the panel and measures a positive charge transfer and result accumulation with a positive result (1) 605 in FIG. 6. In another embodiment, the two-phase, half-wave mode includes: 1) a first phase PHI1 601 in which the first switch $S_{W1}$ and the fourth switch $S_{W4}$ are turned on and the second switch $S_{W2}$, the third switch $S_{W3}$, the fifth switch $S_{W5}$, and the sixth switch $S_{W6}$ are turned off; and 2) a second phase PHI2 602 in which the second switch $S_{W2}$ and the fifth switch $S_{W5}$ are turned on and the first switch $S_{W1}$, the third switch $S_{W3}$, the fourth switch $S_{W4}$, and the sixth switch $S_{W6}$ are turned off. In this embodiment, there are three switches in each the first set of switches 411 and second set of switches 413. As shown in the waveforms 600, the third phase PHI1 and fourth phase PHI4 are not used, so the switches $S_{W3}$ and $S_{W6}$ are permanently off.

In another embodiment, there may be four switches $S_{W1}$, $S_{W2}$, $S_{W4}$ and $S_{W5}$, with two in each of the first set of switches 411 and the second set of switches 413 (not illustrated), and the two-phase, half-wave mode includes: 1) a first phase in which the first switch $S_{W1}$ and the third switch $S_{W4}$ are turned on and the second switch $S_{W2}$ and fourth switch $S_{W5}$ are turned off; and 2) a second phase in which the second switch $S_{W2}$ and the fourth switch $S_{W5}$ are turned on and the first switch $S_{W1}$ and the third switch $S_{W4}$ are turned off.

FIG. 7 is a waveform diagram illustrating operational waveforms 700 in a three-phase, half-wave mode with noise subtraction according to another embodiment. The operational sequence of the six switches of HV capacitance-sensing circuit 400 in the three-phase, half-wave mode is set forth in the following Table 5.

TABLE 5

Operational Sequence of Switches in the three-phase, half-wave mode with noise subtraction

| Phase # | SW1 | SW2 | SW3 | SW4 | SW5 | SW6 | Comment |
|---|---|---|---|---|---|---|---|
| PHI1 | ON | OFF | OFF | ON | OFF | OFF | Charge panel from $V_{DR}$ |
| PHI2 | OFF | ON | OFF | OFF | ON | OFF | Positive charge transfer and result accumulation with positive sign (1) |
| PHI3 | OFF | ON | OFF | OFF | ON | OFF | Noise integration and accumulation with negative sign (3) |

Referring to FIGS. 4 and 7, during a circuit conversion function by the HV capacitance-sensing circuit 400 in the three-phase, half-wave mode, the HV capacitance-sensing circuit 400 charges the panel, measures a positive charge transfer and result accumulation with a positive result (1) 705 in FIG. 7 and measures noise integration and accumulation with negative sign (3) 706 in FIG. 7. In another embodiment, the three-phase, half-wave mode includes: 1) a first phase PHI1 701 in which the first switch $S_{W1}$ and the fourth switch $S_{W4}$ are turned on and the second switch $S_{W2}$, the third switch $S_{W3}$, the fifth switch $S_{W5}$, and the sixth switch $S_{W6}$ are turned off; 2) a second phase PHI2 702 in which the second switch $S_{W2}$ and the fifth switch $S_{W5}$ are turned on and the first switch $S_{W1}$, the third switch $S_{W3}$, the fourth switch $S_{W4}$, and the sixth switch $S_{W6}$ are turned off; and 3) a third phase PHI3 703 in which the second switch $S_{W2}$ and the fifth switch $S_{W5}$ are turned on and the first switch $S_{W1}$, the third switch $S_{W3}$, the fourth switch $S_{W4}$, and the sixth switch $S_{W6}$ are turned off. In this embodiment, there are three switches in each the first set of switches 411 and second set of switches 413. As shown in the waveforms 700, the fourth phase PHI4 is not used.

In another embodiment, there may be four switches $S_{W1}$-$S_{W4}$, with two in each of the first set of switches 411 and the second set of switches 413 (not illustrated), and the three-phase, half-wave mode includes: 1) a first phase in which the first switch $S_{W1}$ and the third switch $S_{W3}$ are turned on and the second switch $S_{W2}$ and the fourth switch $S_{W4}$ are turned off; 2) a second phase in which the second switch $S_{W2}$ and the fourth switch $S_{W4}$ are turned on and the first switch $S_{W1}$ and the third switch $S_{W3}$ are turned off; and 3) a third phase in which the second switch $S_{W2}$ and the fourth switch $S_{W4}$ are turned on and the first switch $S_{W1}$ and the third switch $S_{W3}$ are turned off. In another embodiment, in some half-wave modes, the Sw3 and Sw6 are always off instead of removed as would be appreciated by one of ordinary skill in the art.

Relative comparisons of operational frequency of the different modes are provided in Table 6.

TABLE 6

Operation Frequency Comparison of different modes

| # | Configuration | Operation frequency (relative) |
|---|---|---|
| 1 | 4 Phase Full-way Mode | 0.5x |
| 2 | 2 Phase Half-way Mode | 1x |
| 3 | 3 Phase Half-way Mode with Noise Subtraction | ≈0.7x |

The operation frequency is determined by a time constant of the panel since the panel cannot be charged or discharged faster than some value, typically $3\tau$, where $\tau$—is the panel's RC network equivalent time constant. But different operation sequences use different numbers of panel recharge cycles for one full cycle, allowing the circuit to operate at different frequencies. The two-phase, half-wave mode of FIG. 6 is the fastest since it only uses two cycles for operation. The three-phase, half-wave mode of FIG. 7 is next, following by the four-phase, half-wave mode of FIG. 5.

The low-frequency noise suppression operates in the following way for the four-phase, full-wave mode. In the first phase PHI1 501, the HV capacitance-sensing circuit 400 charges the touch pane. In the second phase PHI2 502, the HV capacitance-sensing circuit 400 integrates input noise as a positive charge transfer and adds a result to the conversion with a positive sign. In the third phase PHI3 503, the HV capacitance-sensing circuit 400 discharges the panel. In the fourth phase PHI4 504, the HV capacitance-sensing circuit 400 integrates input noise as a negative charge transfer and subtracts from result previously accumulated result. It should be noted that the integrator output voltage, caused by a useful signal being positive after completion of the second phase and being negative after completion of the fourth phase. The useful signal response is increased after subtraction integration results from the fourth and second phases. The three-phase, half-wave mode also demonstrates low-frequency noise suppression abilities in similar matter as for the four-phase full-wave mode. Having the additional operation in the third phase where noise is "listened" to, integrated and subtracted from the previous conversion result, there are no useful (touch) panel current flows during the third phase, as the panel is considered to be fully recharged to $V_{REF}$ during the second phase.

The following methods 800, 820, and 840 may be performed by processing logic that may comprise hardware (circuitry, dedicated logic, etc.), software (such as is run on a general purpose computing system or a dedicated machine), firmware (embedded software), or any combination thereof. In one embodiment, the high-voltage capacitance-sensing circuit 400 of FIG. 4, or high-voltage capacitance-sensing circuit 900 of FIG. 9, or high-voltage capacitance-sensing circuit 1000 of FIG. 10 performs the methods 800, 820, and 840. In one embodiment, the processing device 1510 of FIG. 15 performs the methods 800, 900, and 920. Alternatively, other components of the electronic system 1500 perform some or all of the operations of methods 800, 820, and 840.

Figure 8:
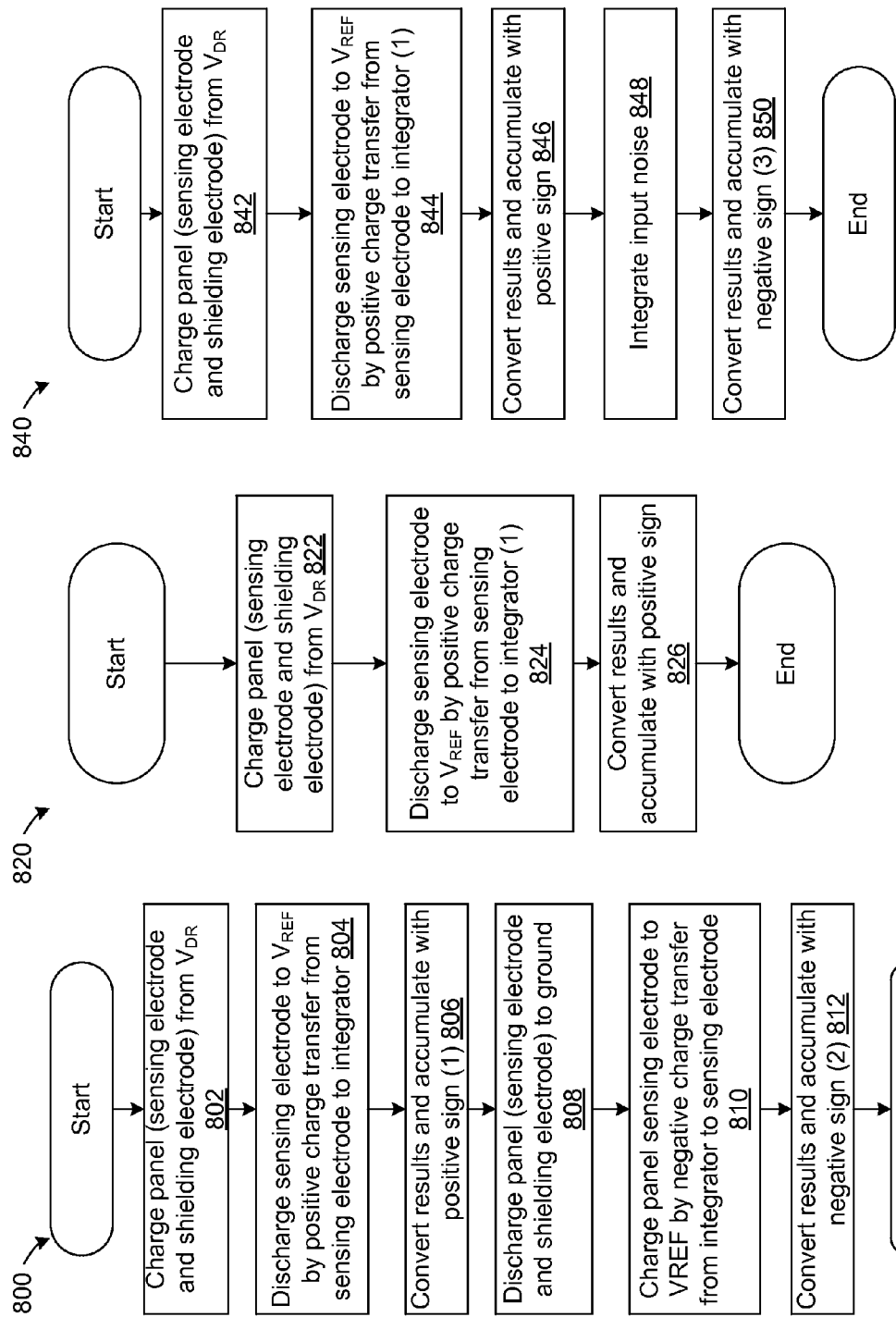
FIG. 8A is a flow diagram of a method of self-capacitance sensing in a four-phase, full-wave mode according to one embodiment.
FIG. 8B is a flow diagram of a method of self-capacitance sensing in a two-phase, half-wave mode according to another embodiment.
FIG. 8C is a flow diagram of a method of self-capacitance sensing in a three-phase, half-wave mode with noise subtraction according to another embodiment.

FIG. 8A is a flow diagram of a method 800 of self-capacitance sensing in a four-phase, full-wave mode according to one embodiment. Referring to FIG. 8A, the method 800 begins with processing logic charging a panel (e.g., sensing electrode and shielding electrode) with a sensing voltage, $V_{DR}$ (block 802) ($S_{W1}$ and $S_{W4}$ are turned on to drive V_SENSE and V_SHIELD by $V_{DR}$ 406). The processing logic discharges the sensing electrode to the reference voltage ($V_{REF}$) by positive charge transfer from sensing electrode to a capacitance-sensing channel (e.g., an active integrator) (block 804). The processing logic turns $SW_2$ and $S_{W5}$ on, for example. The processing logic converts a result and accumulates the result with a positive sign (1) (block 806). The processing logic discharges the panel (sensing electrode and shielding electrode) to a ground potential (block 808). For example, the processing logic turns on $S_{W3}$ and $S_{W6}$. The processing logic charges the sensing electrode to the reference voltage ($V_{REF}$) by a negative charge transfer from the capacitance-sensing channel (e.g., active integrator) to the sensing electrode (block 810). The processing logic converts a result and accumulates the result with a negative sign (2) (block 812); and the method 800 ends.

FIG. 8B is a flow diagram of a method 820 of self-capacitance sensing in a two-phase, half-wave mode according to another embodiment. Referring to FIG. 8B, the method 820 begins with processing logic charging a panel (e.g., sensing electrode and shielding electrode) with a sensing voltage, $V_{DR}$ (block 822). The processing logic discharges the sensing electrode to the reference voltage ($V_{REF}$) by positive charge transfer from the sensing electrode to a capacitance-sensing channel (e.g., an active integrator) (block 824). The processing logic converts a result and accumulates the result with a positive sign (1) (block 826); and the method 820 ends.

FIG. 8C is a flow diagram of a method 840 of self-capacitance sensing in a three-phase, half-wave mode with noise subtraction according to another embodiment. Referring to FIG. 8C, the method 840 begins with processing logic charging a panel (e.g., sensing electrode and shielding electrode) with a sensing voltage, $V_{DR}$ (block 842). The processing logic discharges the sensing electrode to the reference voltage ($V_{REF}$) by positive charge transfer from the sensing electrode to a capacitance-sensing channel (e.g., an active integrator) (block 844). The processing logic converts a result and accumulates the result with a positive sign (1) (block 846). The processing logic integrates input noise (block 848). The processing logic converts a result and accumulates the result with a negative sign (3) (block 850); and the method 840 ends.

In another embodiment, the method further includes communicating with a host processor over a communication channel and the capacitance-sensing circuit is galvanically isolated from the host processor.

The methods described above regarding HV self-capacitance sensing can be implemented by a high-voltage capacitance-sensing circuit, which may be implemented in a capacitive touch screen controller. In one embodiment, the capacitive touch screen controller is the TrueTouch® capacitive touchscreen controllers, such as the CY8CTMA5xx family of TrueTouch® Multi-Touch All-Points touchscreen controllers, developed by Cypress Semiconductor Corporation of San Jose, Calif. The TrueTouch® capacitive touchscreen controllers sensing technology to resolve touch locations of multiple fingers and a stylus on the touch-screens, supports leading operating systems, and is optimized for low-power multi-touch gesture and all-point touchscreen functionality. Alternatively, the touch position calculation features may be implemented in other touchscreen controllers, or other touch controllers of touch-sensing devices. In one embodiment, the touch position calculation features may be implemented with other touch filtering algorithms as would be appreciated by one of ordinary skill in the art having the benefit of this disclosure.

Figure 9:
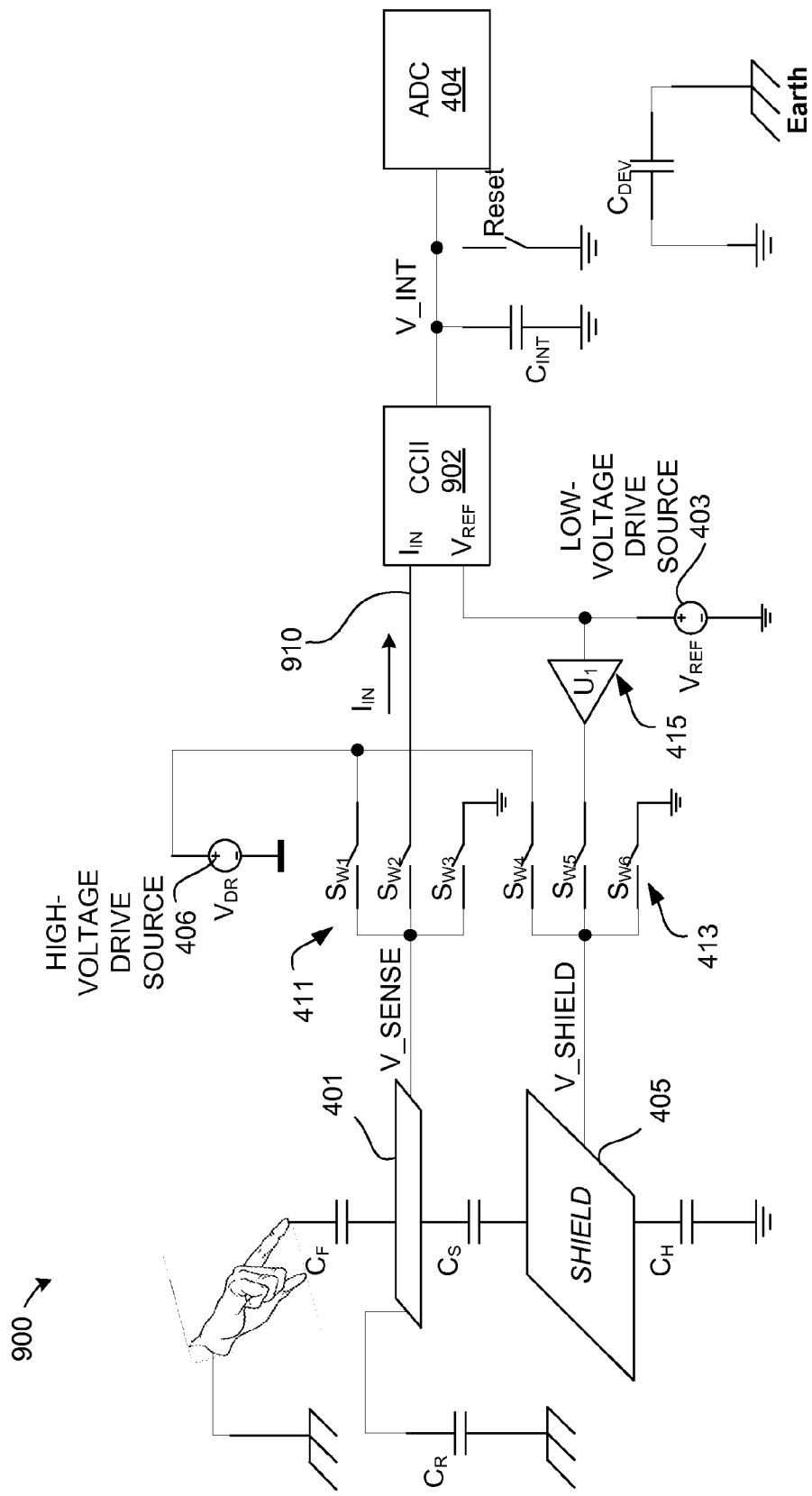
FIG. 9 is a circuit diagram illustrating another high-voltage capacitance-sensing circuit with a current conveyor for self-capacitance sensing according to another embodiment.

FIG. 9 is a circuit diagram illustrating another high-voltage capacitance-sensing circuit 900 with a current conveyor integrator 902 for self-capacitance sensing according to another embodiment. The HV capacitance-sensing circuit 900 is similar to the HV capacitance-sensing circuit 400 as noted by similar reference labels. However, in the HV capacitance-sensing circuit 900, an operational amplifier-based integrator is replaced with a current conveyor integrator 902 at an input node 910 for the capacitance-sensing channel.

Figure 10:
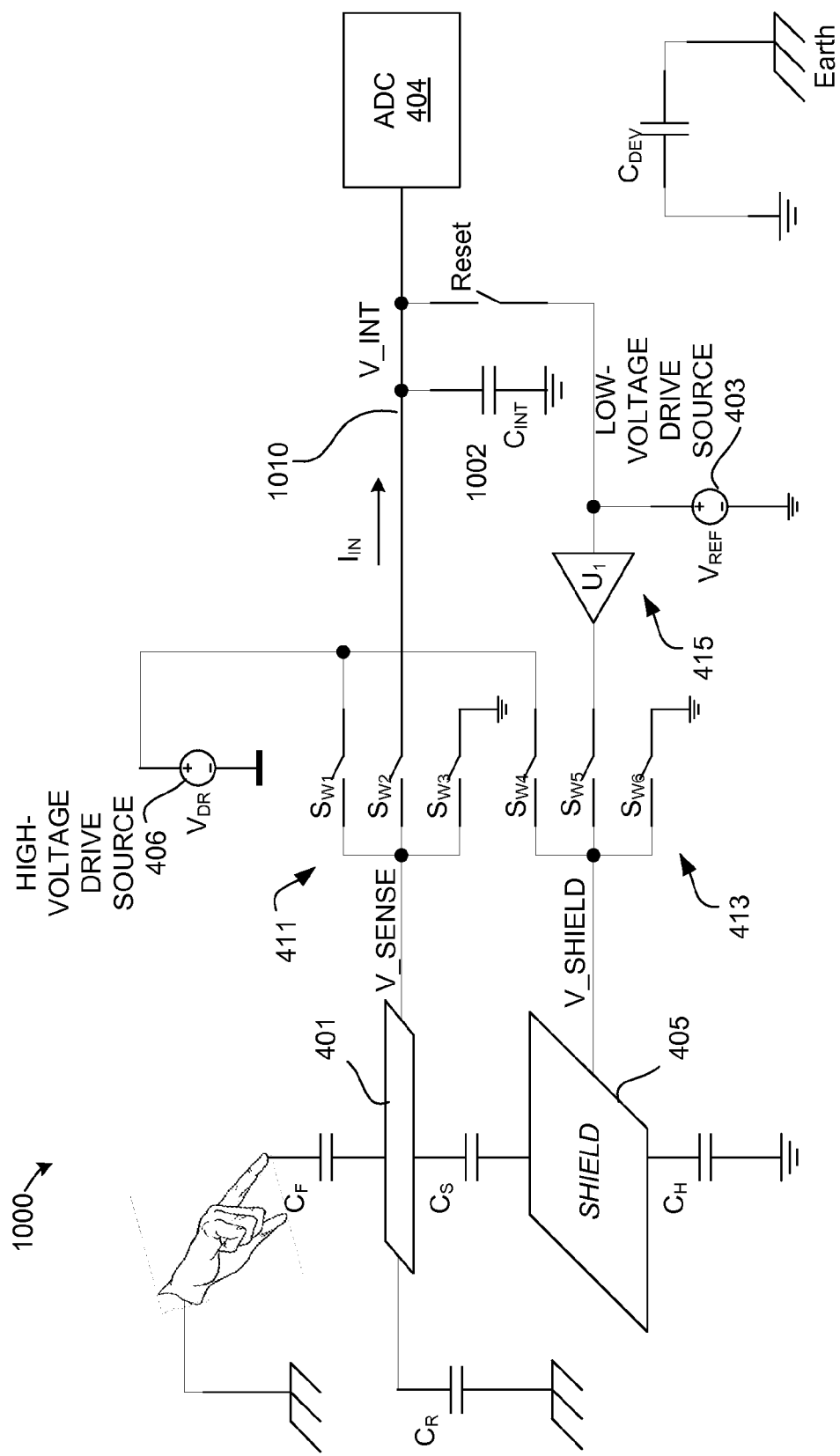
FIG. 10 is a circuit diagram illustrating another high-voltage capacitance-sensing circuit with a passive integrator for self-capacitance sensing according to another embodiment.

FIG. 10 is a circuit diagram illustrating another high-voltage capacitance-sensing circuit with a passive integrator for self-capacitance sensing according to another embodiment. The HV capacitance-sensing circuit 1000 is similar to the HV capacitance-sensing circuit 400 as noted by similar reference labels. However, in the HV capacitance-sensing circuit 1000, an operational amplifier-based integrator is replaced with a passive integrator 1002 at an input node 1010 for the capacitance-sensing channel.

There is another way for the high-sensitivity, low noise self-capacitance sensing implementation. It is based on the driving of entire touch controller chip from external high-voltage signal using the floating ground principle as illustrated in FIG. 11.

Figure 11:
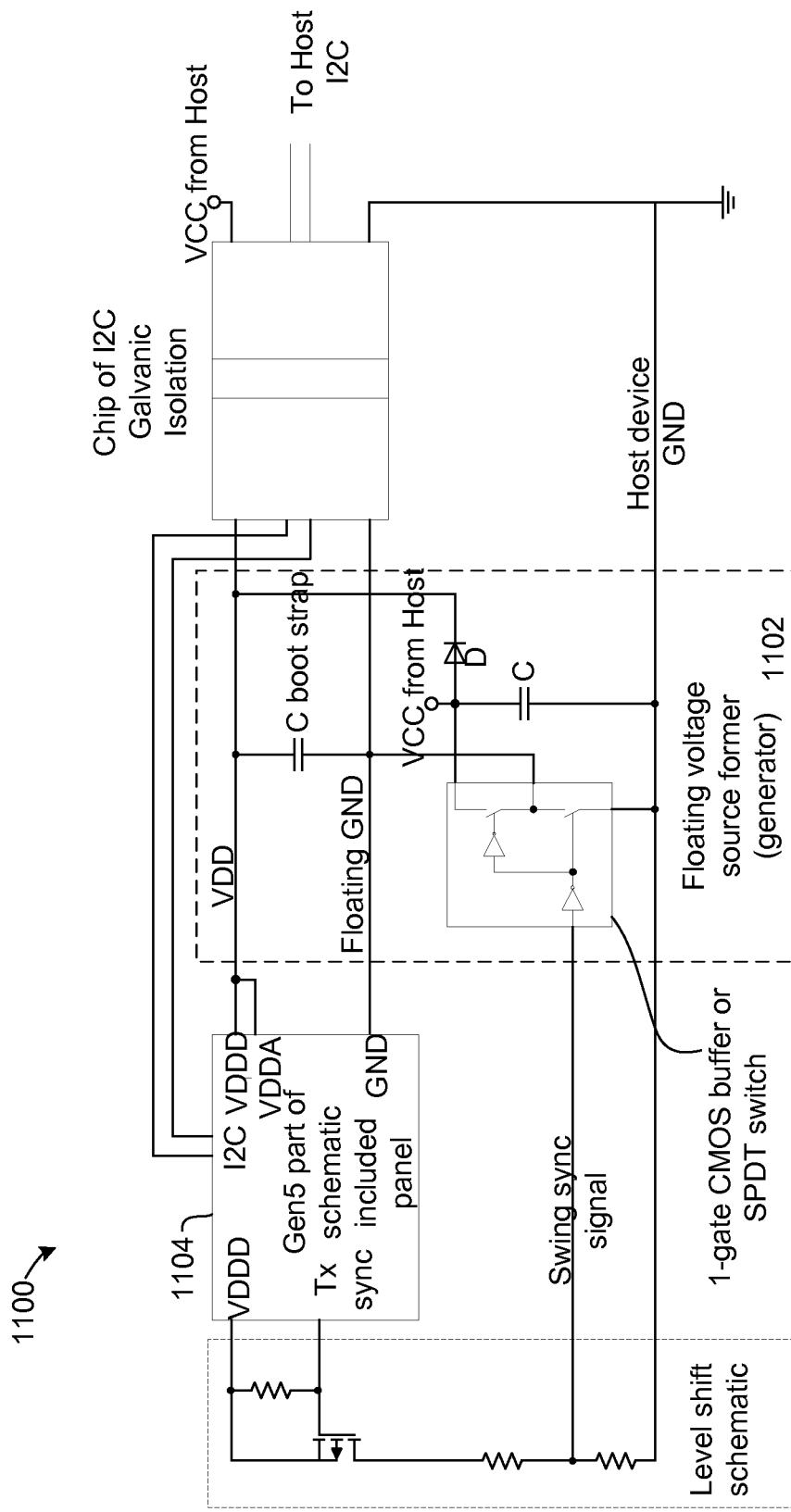
FIG. 11 is a block diagram illustrating a floating power supply for a high-voltage capacitance-sensing circuit and a host according to one embodiment.

FIG. 11 is a block diagram illustrating a floating power supply 1102 for a high-voltage capacitance-sensing circuit 1100 and a host according to one embodiment. A touch controller chip (integrated circuit) 1104 (e.g., Generation 5 or Gen5 of the TrueTouch® controller device) can be used for high-sensitivity implementations described herein, without changing the integrated circuit.

In this floating ground self-capacitance method, a sensors excitation signal is applied between our chip ground and the host device ground. The floating ground means that the potential between our chip ground and host device ground isn't zero. This potential can be controlled by touch controller 1104. The functional simplified schematics for two panel cases are shown in FIGS. 12A-12B.

Figure 12A:
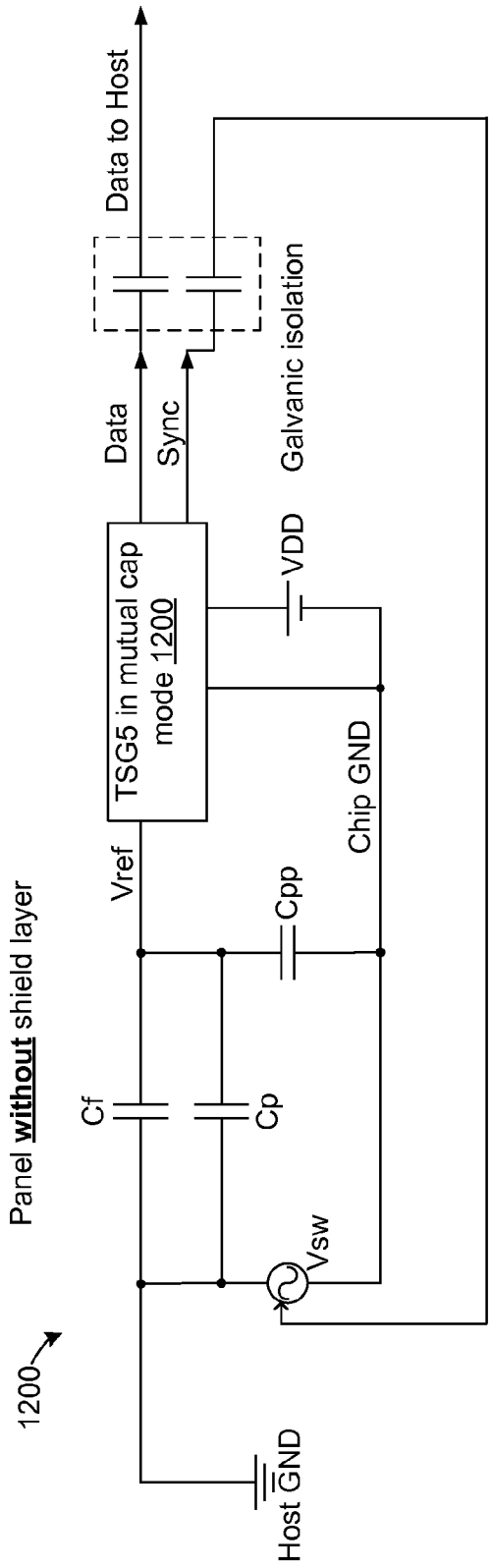
FIGS. 12A-12B are circuit diagrams illustrating a simplified functional equivalent schematic of the floating power supply for the high-voltage capacitance-sensing circuit and the host of FIG. 11 with and without a shield layer according to one embodiment.
Figure 12B:
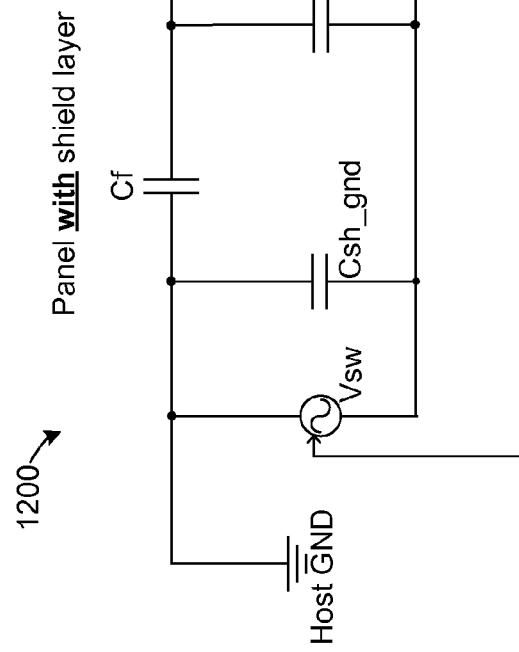

FIGS. 12A-12B are circuit diagrams illustrating a simplified functional equivalent schematic of the floating power supply for the high-voltage capacitance-sensing circuit and the host of FIG. 11 with and without a shield layer according to one embodiment. FIG. 12A shows the floating power supply for the touch controller 1200 when the panel does not include a shield layer. FIG. 12B shows the floating power supply for the touch controller 1200 when the panel does include a shield layer. These embodiments allow self-capacitance measurements (Cp) of the sensing electrode and of the capacitance (Cf) between a finger and the sensing element.

Figure 13A:
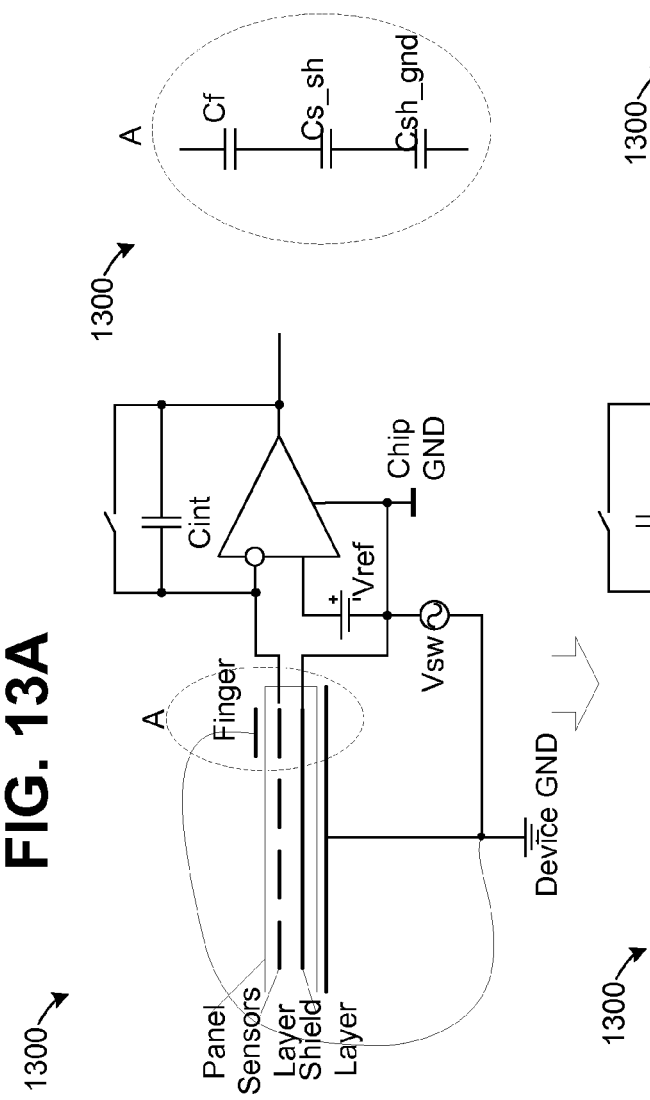
FIGS. 13A-13C are circuit diagrams of a simplified Analog Front-End (AFE) of a high-voltage capacitance-sensing circuit according to one embodiment.
Figure 13B:
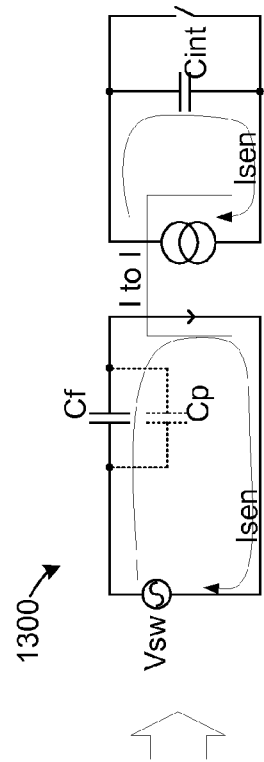
Figure 13C:
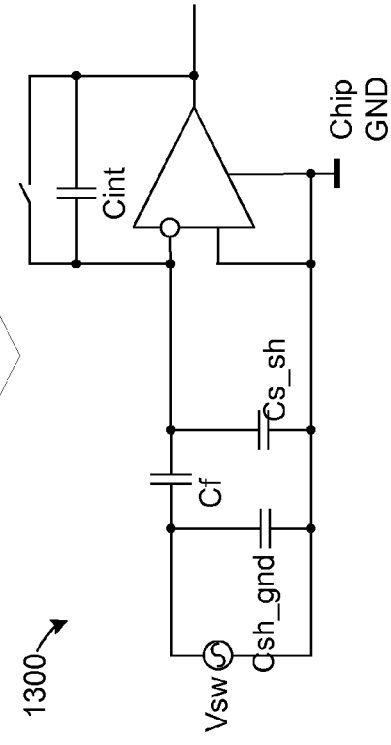

FIGS. 13A-13C are circuit diagrams of a simplified AFE of a high-voltage capacitance-sensing circuit 1300 according to one embodiment. The circuit diagrams show the simplified AFE schematic and the measured sensor current loop Isen. The voltage on the integrator capacitor Cint can be calculated by the following equation (6):

$$V_{Cint} = V_{sw} \cdot \frac{1}{C_{int}} \cdot C_f \quad (6)$$

Figure 14:
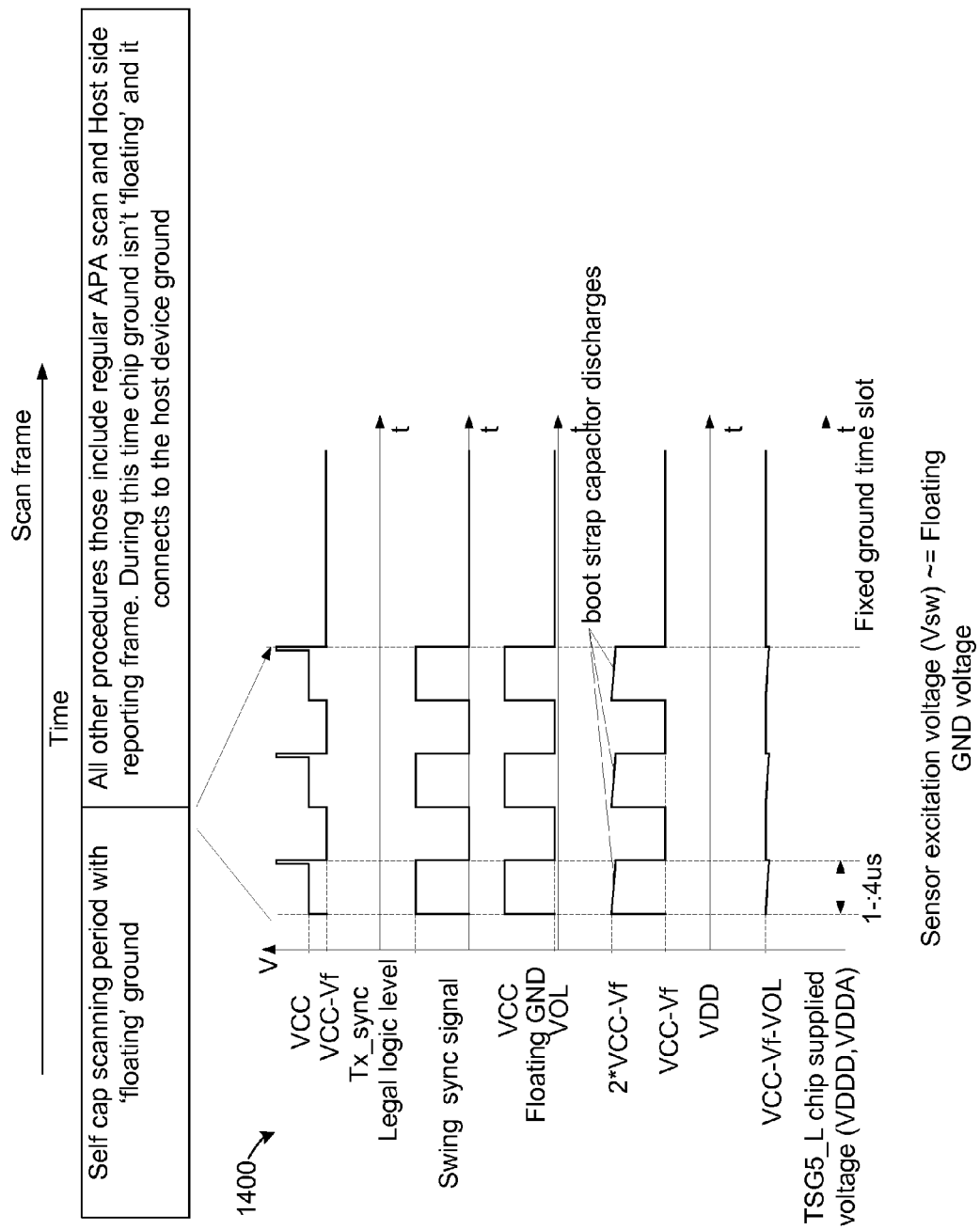
FIG. 14 is a diagram illustrating timing waveforms of a high-voltage capacitance-sensing circuit with the floating ground configuration according to one embodiment.

A capacitance bootstrap technique creates the floating ground and sensor excitation voltage source at same time. The level shift schematic transforms TX sync signal voltage to the legal logic level of the swing sync signal. A single chip I2C galvanic isolator or I2C level translator may be used for the host processor communication. The operation diagrams are illustrated in FIG. 14.

For implementations that make use of an isolated device ground, standard DC-coupled communications interfaces (e.g., I2C, SPI, UART) do not work. Either alternate communication interfaces or special treatment of the standard interface is required to allow communications with a host device (e.g., host processor). The simplest form of isolation is through series capacitors. Such communications is common in serial interfaces such as Fibre Channel and Ethernet. For such an interface to operate, the source signaling must be DC-balanced such as that found in 8B10B, Manchester, biphase (differential Manchester), or similar encodings. These DC-balanced communications forms can also be coupled magneticly (through pulse transformers).

To maintain interoperability with a standard DC-coupled communications link and a wide range modulation of the local ground, the galvanic isolation block of FIG. 11 would need to be used. Such a block is normally implemented using optical isolators which can communicate static (i.e., DC) states, while offering hundreds to thousands of volts of isolation. Alternately, if the amount of shift in the device local ground (vs. that of the host ground) is sufficiently small, differential drivers and receivers can be used. For example, RS-485 standard receivers allow a common mode operating range of +12V to −7V, which would allow a local ground modulation of up to 7V.

Figure 15:
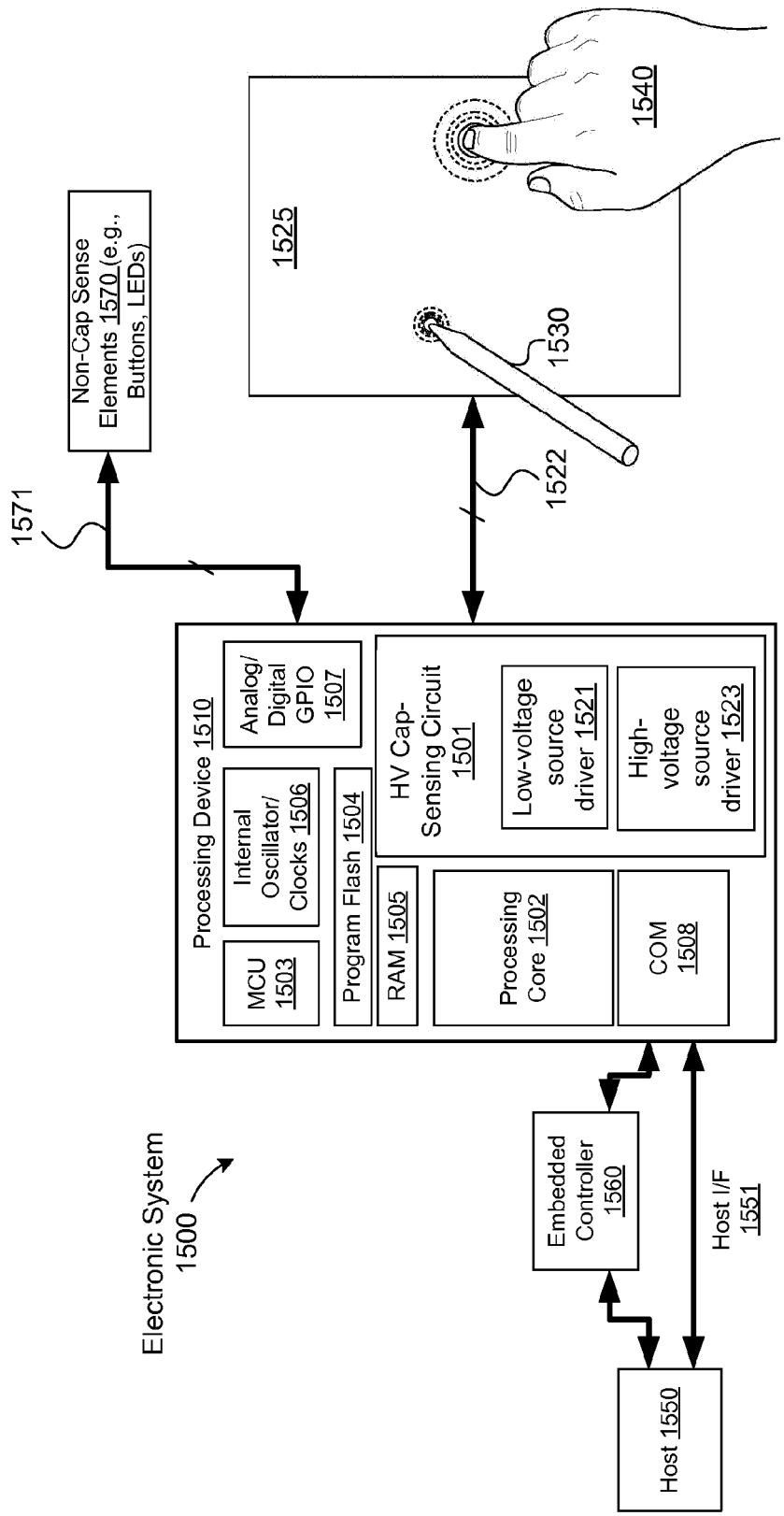
FIG. 15 is a block diagram illustrating one embodiment of an electronic system having a processing device with high-voltage, high-sensitivity self-capacitance sensing.

In other embodiments, an integrated circuit including the HV-capacitance-sensing circuit further includes a communication channel coupled to a host processor (e.g., 1550 of FIG. 15). The HV capacitance-sensing circuit (e.g., 1501 of FIG. 15) is galvanicly isolated from the host processor using one of the galvanic isolation techniques described herein.

FIG. 14 is a diagram illustrating timing waveforms 1400 of a high-voltage capacitance-sensing circuit with the floating ground configuration according to one embodiment. During a scan frame, the timing waveforms 1400 can be performed during a self-capacitance scanning period with a floating ground. After other procedures may be performed in other all-points-addressable APA scan and host side reporting frame. During this time, the chip ground may not be floating and it connects to the host device ground.

The embodiments described herein may achieve various embodiments. For example, in some embodiments, the HV self-capacitance sensing techniques (e.g., HV capacitance-sensing circuits 400, 900, 1000) have the ability to utilize a high-voltage drive in a self-capacitance mode. These embodiments permit low capacitance baseline and noise and have the ability to sense small capacitance changes (e.g., for hover events or proximity events). The operations of the first and second sets of switches convert a touch controller into a high-sensitive touch controller. Other embodiments, such as those illustrated in FIG. 11, have the ability of high-voltage drive in a self-capacitance mode and have ultra-low capacitance baseline and noise. These techniques also have the ability to sense small capacitance changes (e.g., for hover events or proximity events). These techniques can convert a touch controller into a high-sensitive touch controller by implement floating ground concept for the entire chip. The technique of the excitation signal transfer from touch controller to the floating power supply using the bootstrap technique for supply and excitation signal generation for the power touch controller.

The embodiments described herein may allow high-sensitivity, high distance capacitance sensing by reducing a non-informative baseline signal from the parasitic capacitance without adding noise from baseline circuits and by providing the ability of the high-voltage panel drive at same time. Reducing the non-informative input signal component is used to obtain system noise reduction. Some embodiments utilize an input multiplexer for achieving combination of high-excitation voltage in combination with current of a low-voltage sensing circuit without using additional baseline compensation circuits or arrangements. Different control techniques for the multiplexer control to achieve various modes with different combinations of excitation frequency and noise suppression abilities, such as described herein for the the four-phase, full-wave mode, the two-phase, half-wave mode and the three-phase, half-wave mode described herein. For these embodiments, a floating power supply may not be used, but high-voltage driver and a high-voltage mux can be used. For the embodiments, which do not use the floating power supply, a sequence and a charge to code converter, such as an integrator and ADC as described herein, can be used. Providing the floating power supply to existing touch controllers can also be used for baseline reduction and higher excitation voltage. The excitation signal propagation from a floating device to the excitation source can also be done. In other embodiments, the excitation signal and touch controller floating power generation can use bootstrap circuit. For the embodiments with the floating power supply, a level translator or galvanic isolation circuit are used. For these embodiments, a method of synchronization of the floating excitation source with sensing chip demodulation can be performed. This can be synchronization from touch controller to excitation source or from excitation source to the touch controller, as described herein.

The embodiments described herein can be used in various applications, as well as many others: fingerprint sensors, seat occupant detection, long-range proximity sensing, motion capture systems, toys with capacitive proximity sensing, or the like. For example, the systems can be used in a matrix and a switch fingerprint sensor using the self-capacitance sensing techniques described herein.

FIG. 15 is a block diagram illustrating one embodiment of an electronic system 1500 having a processing device 1510 including high-voltage capacitance-sensing circuit 1520. The HV capacitance-sensing circuit 1520 includes both a low-voltage source driver 1521 and a high-voltage source driver 1523 Details regarding the high-voltage capacitance-sensing circuit 1520 are described in more detail with respect to FIGS. 4, 9, and 10. The processing device 1510 is configured to detect one or more touches on a touch-sensing device, such as the capacitive sense array 1525. The processing device can detect conductive objects, such as touch objects 1540 (fingers or passive styluses, an active stylus 1530, or any combination thereof. The high-voltage capacitance-sensing circuit 1501 can measure touch data on the capacitive sense array 1525. The touch data may be represented as multiple cells, each cell representing an intersection of sense elements (e.g., electrodes) of the capacitive sense array 1525. In another embodiment, the touch data is a 2D capacitive image of the capacitive sense array 1525. In one embodiment, when the high-voltage capacitance-sensing circuit 1501 measures mutual capacitance of the touch-sensing device (e.g., capacitive sense array 1525), the high-voltage capacitance-sensing circuit 1501 obtains a 2D capacitive image of the touch-sensing device and processes the data for peaks and positional information. In another embodiment, the processing device 1510 is a microcontroller that obtains a capacitance touch signal data set, such as from a sense array, and finger detection firmware executing on the microcontroller identifies data set areas that indicate touches, detects and processes peaks, calculates the coordinates, or any combination therefore. The firmware identifies the peaks using the embodiments described herein. The firmware can calculate a precise coordinate for the resulting peaks. In one embodiment, the firmware can calculate the precise coordinates for the resulting peaks using a centroid algorithm, which calculates a centroid of the touch, the centroid being a center of mass of the touch. The centroid may be an X/Y coordinate of the touch. Alternatively, other coordinate interpolation algorithms may be used to determine the coordinates of the resulting peaks. The microcontroller can report the precise coordinates to a host processor, as well as other information.

Electronic system 1500 includes processing device 1510, capacitive sense array 1525, stylus 1530, host processor 1550, embedded controller 1560, and non-capacitive sense elements 1570. The capacitive sense elements are electrodes of conductive material, such as copper. The sense elements may also be part of an ITO panel. The capacitive sense elements can be configurable to allow the capacitive-sensing circuit 1501 to measure self-capacitance, mutual capacitance, or any combination thereof. In the depicted embodiment, the electronic system 1500 includes the capacitive sense array 1525 coupled to the processing device 1510 via bus 1522. The capacitive sense array 1525 may include a multi-dimension capacitive sense array. The multi-dimension sense array includes multiple sense elements, organized as rows and columns. In another embodiment, the capacitive sense array 1525 operates as an all-points-addressable ("APA") mutual capacitive sense array. In another embodiment, the capacitive sense array 1525 operates as a coupled-charge receiver. In another embodiment, the capacitive sense array 1525 is non-transparent capacitive sense array (e.g., PC touchpad). The capacitive sense array 1525 may be disposed to have a flat surface profile. Alternatively, the capacitive sense array 1525 may have non-flat surface profiles. Alternatively, other configurations of capacitive sense arrays may be used. For example, instead of vertical columns and horizontal rows, the capacitive sense array 1525 may have a hexagon arrangement, or the like, as would be appreciated by one of ordinary skill in the art having the benefit of this disclosure. In one embodiment, the capacitive sense array 1525 may be included in an ITO panel or a touch screen panel.

The operations and configurations of the processing device 1510 and the capacitive sense array 1525 for detecting and tracking the touch object 1540 and stylus 1530 are described herein. In short, the processing device 1510 is configurable to detect a presence of the touch object 1540, a presence of a stylus 1530 on the capacitive sense array 1525, or any combination thereof. The processing device 1510 may detect and track the stylus 1530 and the touch object 1540 individually on the capacitive sense array 1525. In one embodiment, the processing device 1510 can detect and track both the stylus 1530 and touch object 1540 concurrently on the capacitive sense array 1525. If the touching object is an active stylus, in one embodiment, the active stylus 1530 is configurable to operate as the timing "master," and the processing device 1510 adjusts the timing of the capacitive sense array 1525 to match that of the active stylus 1530 when the active stylus 1530 is in use. In one embodiment, the capacitive sense array 1525 capacitively couples with the active stylus 1530, as opposed to conventional inductive stylus applications. It should also be noted that the same assembly used for the capacitive sense array 1525, which is configurable to detect touch objects 1540, is also used to detect and track a stylus 1530 without an additional PCB layer for inductively tracking the active stylus 1530.

In the depicted embodiment, the processing device 1510 includes analog and/or digital general purpose input/output ("GPIO") ports 1507. GPIO ports 1507 may be programmable. GPIO ports 1507 may be coupled to a Programmable Interconnect and Logic ("PIL"), which acts as an interconnect between GPIO ports 1507 and a digital block array of the processing device 1510 (not shown). The digital block array may be configurable to implement a variety of digital logic circuits (e.g., DACs, digital filters, or digital control systems) using, in one embodiment, configurable user modules ("UMs"). The digital block array may be coupled to a system bus. Processing device 1510 may also include memory, such as random access memory ("RAM") 1505 and program flash 1504. RAM 1505 may be static RAM ("SRAM"), and program flash 1504 may be a non-volatile storage, which may be used to store firmware (e.g., control algorithms executable by processing core 1502 to implement operations described herein). Processing device 1510 may also include a memory controller unit ("MCU") 1503 coupled to memory and the processing core 1502. The processing core 1502 is a processing element configured to execute instructions or perform operations. The processing device 1510 may include other processing elements as would be appreciated by one of ordinary skill in the art having the benefit of this disclosure. It should also be noted that the memory may be internal to the processing device or external to it. In the case of the memory being internal, the memory may be coupled to a processing element, such as the processing core 1502. In the case of the memory being external to the processing device, the processing device is coupled to the other device in which the memory resides as would be appreciated by one of ordinary skill in the art having the benefit of this disclosure.

The processing device 1510 may also include an analog block array (not shown). The analog block array is also coupled to the system bus. Analog block array may also be configurable to implement a variety of analog circuits (e.g., ADCs or analog filters) using, in one embodiment, configurable UMs. The analog block array may also be coupled to the GPIO 1507.

As illustrated, high-voltage capacitance-sensing circuit 1501 may be integrated into processing device 1510. Capacitance-sensing circuit 1501 may include analog I/O for coupling to an external component, such as touch-sensor pad (not shown), capacitive sense array 1525, touch-sensor slider (not shown), touch-sensor buttons (not shown), and/or other devices. The high-voltage capacitance-sensing circuit 1501 may be configurable to measure capacitance using mutual-capacitance sensing techniques, self-capacitance sensing technique, charge coupling techniques or the like. In one embodiment, high-voltage capacitance-sensing circuit 1501 operates using a charge accumulation circuit, a capacitance modulation circuit, or other capacitance sensing methods known by those skilled in the art. In an embodiment, the high-voltage capacitance-sensing circuit 1501 is of the Cypress TMA-3xx, TMA-4xx, or TMA-xx families of touch screen controllers. Alternatively, other high-voltage capacitance-sensing circuit s may be used. The mutual capacitive sense arrays, or touch screens, as described herein, may include a transparent, conductive sense array disposed on, in, or under either a visual display itself (e.g. LCD monitor), or a transparent substrate in front of the display. In an embodiment, the TX and RX electrodes are configured in rows and columns, respectively. It should be noted that the rows and columns of electrodes can be configured as TX or RX electrodes by the high-voltage capacitance-sensing circuit 1501 in any chosen combination. In one embodiment, the TX and RX electrodes of the sense array 1525 are configurable to operate as a TX and RX electrodes of a mutual capacitive sense array in a first mode to detect touch objects, and to operate as electrodes of a coupled-charge receiver in a second mode to detect a stylus on the same electrodes of the sense array. The stylus, which generates a stylus TX signal when activated, is used to couple charge to the capacitive sense array, instead of measuring a mutual capacitance at an intersection of a RX electrode and a TX electrode (a sense element) as done during mutual-capacitance sensing. An intersection between two sense elements may be understood as a location at which one sense electrode crosses over or overlaps another, while maintaining galvanic isolation from each other. The high-voltage capacitance-sensing circuit 1501 does not use mutual-capacitance or self-capacitance sensing to measure capacitances of the sense elements when performing a stylus sensing. Rather, the high-voltage capacitance-sensing circuit 1501 measures a charge that is capacitively coupled between the sense array 1525 and the stylus as described herein. The capacitance associated with the intersection between a TX electrode and an RX electrode can be sensed by selecting every available combination of TX electrode and RX electrode. When a touch object, such as a finger or stylus, approaches the capacitive sense array 1525, the object causes a decrease in mutual capacitance between some of the TX/RX electrodes. In another embodiment, the presence of a finger increases the coupling capacitance of the electrodes. Thus, the location of the finger on the capacitive sense array 1525 can be determined by identifying the RX electrode having a decreased coupling capacitance between the RX electrode and the TX electrode to which the TX signal was applied at the time the decreased capacitance was measured on the RX electrode. Therefore, by sequentially determining the capacitances associated with the intersection of electrodes, the locations of one or more inputs can be determined. It should be noted that the process can calibrate the sense elements (intersections of RX and TX electrodes) by determining baselines for the sense elements. It should also be noted that interpolation may be used to detect finger position at better resolutions than the row/column pitch as would be appreciated by one of ordinary skill in the art having the benefit of this disclosure. In addition, various types of coordinate interpolation algorithms may be used to detect the center of the touch as would be appreciated by one of ordinary skill in the art having the benefit of this disclosure.

The high-voltage capacitance-sensing circuit 1501 includes the high-voltage capacitance-sensing circuit 1520. Additional details of the high-voltage capacitance-sensing circuit 1520 are described above with respect to FIGS. 2-8.

In an embodiment, the electronic system 1500 may also include non-capacitive sense elements 1570 coupled to the processing device 1510 via bus 1571 and GPIO port 1507. The non-capacitive sense elements 1570 may include buttons, light emitting diodes ("LEDs"), and other user interface devices, such as a mouse, a keyboard, or other functional keys that do not use capacitance sensing. In one embodiment, buses 1522, and 1571 are embodied in a single bus. Alternatively, these buses may be configured into any combination of one or more separate buses.

Processing device 1510 may include internal oscillator/clocks 1506 and communication block ("COM") 1508. In another embodiment, the processing device 1510 includes a spread spectrum clock (not shown). The oscillator/clocks block 1506 provides clock signals to one or more of the components of processing device 1510. Communication block 1508 may be used to communicate with an external component, such as a host processor 1550, via host interface ("I/F") line 1551. Alternatively, processing device 1510 may also be coupled to embedded controller 1560 to communicate with the external components, such as host processor 1550. In one embodiment, the processing device 1510 is configurable to communicate with the embedded controller 1560 or the host processor 1550 to send and/or receive data.

Processing device 1510 may reside on a common carrier substrate such as, for example, an integrated circuit ("IC") die substrate, a multi-chip module substrate, or the like. Alternatively, the components of processing device 1510 may be one or more separate integrated circuits and/or discrete components. In one exemplary embodiment, processing device 1510 is the Programmable System on a Chip (PSoC®) processing device, developed by Cypress Semiconductor Corporation, San Jose, Calif. Alternatively, processing device 1510 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to a host, but may include a system that measures the capacitance on the sensing device and sends the raw data to a host computer where it is analyzed by an application. In effect, the processing that is done by processing device 1510 may be done in the host.

Capacitance-sensing circuit 1501 may be integrated into the IC of the processing device 1510, or alternatively, in a separate IC. Alternatively, descriptions of high-voltage capacitance-sensing circuit 1501 may be generated and compiled for incorporation into other integrated circuits. For example, behavioral level code describing the high-voltage capacitance-sensing circuit 1501, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe high-voltage capacitance-sensing circuit 1501.

It should be noted that the components of electronic system 1500 may include all the components described above. Alternatively, electronic system 1500 may include some of the components described above.

In one embodiment, the electronic system 1500 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, global position system ("GPS") or a control panel. The embodiments described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons). In one embodiment, these sensing devices include one or more capacitive sensors or other types of capacitance-sensing circuitry. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition, and numeric keypad operation.

The embodiments described herein may be used in various designs of mutual-capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An apparatus comprising a capacitance-sensing circuit coupled to a capacitive-sense array comprising a plurality of electrodes, wherein the capacitance-sensing circuit comprises:
    a self-capacitance sensing channel;
    a first voltage source to drive a reference voltage;
    a second voltage source to drive a sensing voltage, wherein the sensing voltage is greater in magnitude than the reference voltage;
    a first set of switches to selectively couple the self-capacitance sensing channel or the second voltage source to a sensing electrode of the plurality of electrodes; and
    a second set of switches to selectively couple the first voltage source to a shielding electrode of the plurality of electrodes and selectively couple the second voltage source to the shielding electrode.

2. The apparatus of claim 1, further comprising a communication channel coupled to a host processor, wherein the capacitance-sensing circuit is galvanicly isolated from the host processor.

3. The apparatus of claim 1, wherein the first set of switches is operative to selectively couple the self-capacitance sensing channel, the second voltage source, or a ground potential to the sensing electrode, and wherein the second set of switches is operative to selectively couple the first voltage source, the second voltage source, or the ground potential to the shielding electrode.

4. The apparatus of claim 3, wherein the first set of switches comprises a first switch, a second switch and a third switch, wherein the second set of switches comprises a fourth switch, a fifth switch and a sixth switch, and wherein the capacitance-sensing circuit is operative to control the first set of switches and the second set of switches in a four-phase, full-wave mode.

5. The apparatus of claim 4, wherein the four-phase, full-wave mode comprises:
    a first phase in which the first switch and the fourth switch are turned on and the second switch, the third switch, the fifth switch, and the sixth switch are turned off;
    a second phase in which the second switch and the fifth switch are turned on and the first switch, the third switch, the fourth switch, and the sixth switch are turned off;
    a third phase in which the third switch and the sixth switch are turned on and the first switch, the second switch, the fourth switch, and the fifth switch are turned off; and
    a fourth phase in which the second switch and the fifth switch are turned on and the first switch, the third switch, the fourth switch and the sixth switch are turned off.

6. The apparatus of claim 3, wherein the first set of switches comprises a first switch, a second switch and a third switch, wherein the second set of switches comprises a fourth switch, a fifth switch and a sixth switch, and wherein the capacitance-sensing circuit is operative to control the first set of switches and the second set of switches in a two-phase, half-wave mode.

7. The apparatus of claim 6, wherein the two-phase, half-wave mode comprises:
    a first phase in which the first switch and the fourth switch are turned on and the second switch, the third switch, the fifth switch, and the sixth switch are turned off; and
    a second phase in which the second switch and the fifth switch are turned on and the first switch, the third switch, the fourth switch, and the sixth switch are turned off.

8. The apparatus of claim 7, wherein the first set of switches comprises a first switch, a second switch and a third switch, wherein the second set of switches comprises a fourth switch, a fifth switch and a sixth switch, and wherein the capacitance-sensing circuit is operative to control the first set of switches and the second set of switches in a three-phase, half-wave mode.

9. The apparatus of claim 8, wherein the three-phase, half-wave mode comprises:
    a first phase in which the first switch and the fourth switch are turned on and the second switch, the third switch, the fifth switch, and the sixth switch are turned off;
    a second phase in which the second switch and the fifth switch are turned on and the first switch, the third switch, the fourth switch, and the sixth switch are turned off; and
    a third phase in which the second switch and the fifth switch are turned on and the first switch, the third switch, the fourth switch, and the sixth switch are turned off.

10. The apparatus of claim 1, wherein the first set of switches comprises a first switch and a second switch, wherein the second set of switches comprises a third switch and a fourth switch.

11. The apparatus of claim 10, wherein the capacitance-sensing circuit is operative to control the first set of switches and the second set of switches in a two-phase, half-wave mode, wherein the two-phase, half-wave mode comprises:
    a first phase in which the first switch and the third switch are turned on and the second switch and fourth switch are turned off; and
    a second phase in which the second switch and the fourth switch are turned on and the first switch and the third switch are turned off.

12. The apparatus of claim 10, wherein the capacitance-sensing circuit is operative to control the first set of switches and the second set of switches in a three-phase, half-wave mode, wherein the three-phase, half-wave mode comprises:
    a first phase in which the first switch and the third switch $S_{W_3}$ are turned on and the second switch and the fourth switch are turned off;
    a second phase in which the second switch and the fourth switch are turned on and the first switch and the third switch are turned off; and
    a third phase in which the second switch and the fourth switch are turned on and the first switch and the third switch $S_{W_3}$ are turned off.

13. A method comprising:
    driving a shielding electrode by a capacitance-sensing circuit with a reference voltage;

driving the shielding electrode by the capacitance-sensing circuit with a sensing voltage, wherein the sensing voltage is greater in magnitude than the reference voltage;

driving a sensing electrode by the capacitance-sensing circuit with the sensing voltage; and sensing the sensing electrode by a self-capacitance sensing channel of the capacitance-sensing circuit to measure a self-capacitance of the sensing electrode.

14. The method of claim 13, further comprising communicating with a host processor over a communication channel, wherein the capacitance-sensing circuit is galvanically isolated from the host processor.

15. The method of claim 13, wherein the driving and sensing are part of a four-phase, full-wave mode, wherein the four-phase, full-wave mode comprises:

charging the sensing electrode with the sensing voltage from a second voltage source;

discharging the sensing electrode to the reference voltage by a positive charge transfer from the sensing electrode to the self-capacitance sensing channel, wherein the reference voltage is provided by a first voltage source;

converting the positive charge transfer to a first digital value and accumulating the first digital value with a positive sign;

discharging the sensing electrode and the shielding electrode to a ground potential;

charging the sensing electrode and the shielding electrode to the reference voltage by a negative charge transfer from the self-capacitance sensing channel to the sensing electrode; and converting the negative charge transfer to a second digital value and accumulating the second digital value with a negative sign.

16. The method of claim 13, wherein the driving and sensing are part of a two-phase, half-wave mode, wherein the two-phase, half-wave mode comprises:

charging the sensing electrode with the sensing voltage from a second voltage source;

discharging the sensing electrode to the reference voltage by a positive charge transfer from the sensing electrode to the self-capacitance sensing channel, wherein the reference voltage is provided by a first voltage source; and converting the positive charge transfer to a first digital value and accumulating the first digital value with a positive sign.

17. The method of claim 13, wherein the driving and sensing are part of a three-phase, half-wave mode, wherein the three-phase, half-wave mode comprises:

charging the sensing electrode with the sensing voltage from a second voltage source;

discharging the sensing electrode to the reference voltage by a positive charge transfer from the sensing electrode to the self-capacitance sensing channel, wherein the reference voltage is provided by a first voltage source;

converting the positive charge transfer to a first digital value and accumulating the first digital value with a positive sign;

integrate input noise; and converting the integrated input noise to a second digital value and accumulating the second digital value with a negative sign.

18. An apparatus comprising:

a capacitive-sense array of a plurality of electrodes; and a processing device coupled to the capacitive-sense array, wherein the processing device is configured to:

drive a shielding electrode by a capacitance-sensing circuit of the processing device with a reference voltage;

drive the shielding electrode by the capacitance-sensing circuit with a sensing voltage, wherein the sensing voltage is greater in magnitude than the reference voltage;

drive a sensing electrode by the capacitance-sensing circuit with the sensing voltage; and sense the sensing electrode by a self-capacitance sensing channel of the capacitance-sensing circuit to measure a self-capacitance of the sensing electrode.

19. The apparatus of claim 18, wherein the processing device further comprises:

a first set of switches to selectively couple the self-capacitance sensing channel or a second voltage source to the sensing electrode, wherein the second voltage source provides the sensing voltage; and a second set of switches to selectively couple a first voltage source or the second voltage source to the shielding electrode, wherein the first voltage source provides the reference voltage, wherein the self-capacitance sensing channel comprises an integrator to measure the self-capacitance of the sensing electrode, and wherein the processing device comprises:

an analog-to-digital converter (ADC) coupled to an output of the integrator, the ADC to convert the measured self-capacitance to a digital value; and processing logic coupled to the ADC, the processing logic to detect a proximity event of a conductive object based on the digital value.

20. The apparatus of claim 18, wherein the processing device is configured to operate in at least one of the following modes:

a four-phase, full-wave mode;

a two-phase, half-wave mode; or a three-phase, half-wave mode.

* * * * *